US005693428A

United States Patent [19]
Fujii et al.

[11] Patent Number: 5,693,428
[45] Date of Patent: Dec. 2, 1997

[54] ORGANIC ELECTROLUMINESCENT DEVICE

[75] Inventors: Takanori Fujii, Sumoto; Takeshi Sano, Hirakata; Yuji Hamada, Kadoma; Kousuke Takeuchi, Hirakata; Kenichi Shibata, Hashimoto, all of Japan

[73] Assignee: Sanyo Electric Co., Ltd., Osaka, Japan

[21] Appl. No.: 596,415

[22] Filed: Feb. 2, 1996

[30] Foreign Application Priority Data

Feb. 6, 1995 [JP] Japan .................. 7-042382
May 16, 1995 [JP] Japan .................. 7-142716

[51] Int. Cl.$^6$ .................. H05B 33/00
[52] U.S. Cl. .................. 428/690; 428/691; 428/917; 313/504
[58] Field of Search .................. 428/690, 691, 428/917; 313/504

[56] References Cited

U.S. PATENT DOCUMENTS 5,126,214  6/1992  Tokailin .................. 428/690
5,294,870  3/1994  Tang et al. .................. 313/504

*Primary Examiner*—Charles Nold
*Attorney, Agent, or Firm*—Merchant, Gould, Smith, Edell, Welter & Schmidt, P.A.

[57] ABSTRACT

In an organic electroluminescent device according to the present invention, at least a carrier transporting layer and a luminescent layer which use an organic material are provided between a hole injection electrode and an electron injection electrode, wherein a luminescent portion having a luminescent peak wavelength different from a luminescent peak wavelength in the luminescent layer is partially provided in such a manner that it is laminated on the luminescent layer, or at least a hole transporting layer having luminous characteristics and an electron transporting layer having luminous characteristics which respectively contain organic materials emitting fluorescence in different colors in a visible region are provided between the hole injection electrode and the electron injection electrode, wherein a hole transporting portion having non-luminous characteristics is partially provided between the hole transporting layer having luminous characteristics and the electron transporting layer having luminous characteristics when the hole transporting layer having luminous characteristics emits light, while an electron transporting portion having non-luminous characteristics is partially provided between the electron transporting layer having luminous characteristics and the hole transporting layer having luminous characteristics when the electron transporting layer having luminous characteristics emits light.

10 Claims, 12 Drawing Sheets

ORGANIC ELECTROLUMINESCENT DEVICE

BACKGROUND OF THE INVENTION

1. Field of the Invention

The present invention relates generally to an organic electroluminescent device having an organic layer having luminous characteristics provided between a hole injection electrode and an electron injection electrode, and more particularly, to an organic electroluminescent device capable of emitting light in a plurality of colors simply and efficiently.

2. Description of the Prior Art

In recent years, the needs of planar display devices, the consumed power and the spatial occupied area of which are smaller than those of a CRT which has been conventionally generally employed, have been increased as information equipments are diversified, for example. Thus an electroluminescent device (hereinafter referred to as an EL device) has been given attention as one of the planar display devices.

The EL device is roughly divided into an inorganic EL device using an inorganic material and an organic EL device using an organic material, depending on the used material.

In the inorganic EL device, a high electric field is generally exerted on a luminescent portion, and electrons are accelerated within the high electric field to collide with a luminescence center, whereby the luminescence center is excited to emit light.

On the other hand, in the organic EL device, electrons and holes are respectively injected into a luminescent portion from an electron injection electrode and a hole injection electrode, the electrons and the holes thus injected are recombined with each other in a luminescence center to excite an organic material, and the organic material emits fluorescence when it is returned from its excited state to its ground state.

In the inorganic EL device, a high voltage of 100 to 200 V is required as its driving voltage because the high electric field is exerted as described above. On the other hand, the organic EL device can be driven at a low voltage of approximately 5 to 20 V. In recent years, therefore, various studies have been undertaken on the organic EL device.

Known examples of the organic EL device include ones having a three-layer structure referred to as a DH structure in which a hole transporting layer, a luminescent layer and an electron transporting layer are laminated between a hole injection electrode and an electron injection electrode, a two-layer structure referred to as an SH-A structure in which a hole transporting layer and a luminescent layer abundant in electron transporting characteristics are laminated between a hole injection electrode and an electron injection electrode, and a two-layer structure referred to as an SH-B structure in which a luminescent layer abundant in hole transporting characteristics and an electron transporting layer are laminated between a hole injection electrode and an electron injection electrode.

Furthermore, in the above-mentioned organic EL device, a light emitting device emitting light in a suitable color can be obtained by suitably selecting a fluorescent material which is a luminescent material.

In recent years, therefore, it is considered that the organic EL device is also utilized as a display device such as a traffic-control sign, a multicolor or full-color display device, and the like, and studies for simultaneously obtaining light in a plurality of colors using the organic EL device have been undertaken.

In recent years, various methods as disclosed in Japanese Patent Laid-Open No. 187192/1991, Japanese Patent Laid-Open No. 68977/1994, and U.S. Pat. No. 5,294,870, for example, have been proposed in order to obtain light in a plurality of colors using an organic EL device.

In the above-mentioned Japanese Patent Laid-Open No. 187192/1991, a method in which in providing a luminescent layer between a hole injection electrode and an electron injection electrode, a plurality of luminescent portions having different luminescent peak wavelengths are well joined to each other using a mask in such a manner that they are not overlapped with each other, the plurality of luminescent portions are formed in a mosaic shape on the same plane, and light is emitted in different colors, respectively, from the luminescent portions has been proposed.

However, the method as disclosed in the gazette has some disadvantages. For example, it is very difficult to well join the plurality of luminescent portions having different luminescent peak wavelengths in such a manner that the luminescent portions are not overlapped with each other to form the plurality of luminescent portions on the same plane, and the luminescent portions having different luminescent peak wavelengths are overlapped with each other in a region where the luminescent portions are joined to each other, whereby the luminance is decreased, and the luminescent color is changed. In addition, a clearance occurs in the region where the luminescent portions are joined to each other, and a current leaks through the clearance, whereby light is not emitted.

In the above-mentioned Japanese Patent Laid-Open No. 68977/1994, a method in which a plurality of organic EL devices having different luminescent peak wavelengths are used, the organic EL devices are successively laminated in such a manner that luminescent portions in the respective organic EL devices are not overlapped with each other, and the organic EL devices are caused to emit light, to obtain light in different colors has been proposed.

However, the method as disclosed in the gazette has some disadvantages. For example, the plurality of organic EL devices are laminated, whereby light emitted in the organic EL device in a position spaced apart from a surface from which light is taken out is introduced through the other organic EL device. Therefore, the light is absorbed, reflected and diffused in the other organic EL devices while it is introduced, whereby the luminance of the light introduced into the surface from which light is taken out is significantly decreased. In addition, the color of the emitted light may, in some cases, be changed halfway. Therefore, light having sufficient luminance and in a suitable color cannot be emitted.

In the above-mentioned U.S. Pat. No. 5,294,870, a method in which an organic EL device emitting light in blue is used in a luminescent layer, and a plurality of fluorescent layers absorbing light in blue and emitting light in green and red are provided on the side on which light emitted in the organic EL device is taken out, thereby to obtain light in a plurality of colors has been proposed.

However, the method as disclosed in the gazette has some disadvantages. For example, visible light low in energy emitted in the luminescent layer is introduced into each of the fluorescent layers through a transparent electrode and a glass substrate which are provided in the organic EL device, whereby the light low in energy emitted in the luminescent layer is reflected, absorbed and diffused by the transparent electrode and the glass substrate while it is introduced into the fluorescent layers, whereby it is further weakened. Therefore, it is difficult to sufficiently excite a fluorescent material in each of the fluorescent layers, it is impossible to sufficiently emit light in green or red in each of the fluorescent layers, and it is impossible to obtain light in a plurality of colors having sufficient luminance.

SUMMARY OF THE INVENTION

A first object of the present invention is to obtain light in a plurality of colors using an organic EL device.

Another object of the present invention is to make it possible to emit light in a plurality of colors having sufficient luminance and in suitable colors simply and efficiently in obtaining the light in a plurality of colors using the organic EL device as described above.

In an organic EL device having at least a carrier transporting layer and a luminescent layer which use an organic material provided between a hole injection electrode and an electron injection electrode, a first organic EL device according to the present invention is characterized in that a luminescent portion having a luminescent peak wavelength different from a luminescent peak wavelength in the luminescent layer is partially provided in such a manner that it is laminated on the luminescent layer.

As in the first organic EL device, when the luminescent portion having the luminescent peak wavelength different from the luminescent peak wavelength in the luminescent layer is partially provided between the hole injection electrode and the electron injection electrode in such a manner that it is laminated on the luminescent layer, the luminescent layer emits light in a region where no luminescent portion is provided, while the luminescent layer functions as a carrier transporting layer transporting electrons and holes to the luminescent portion in a region where the luminescent portion is provided, whereby not the luminescent layer but the luminescent portion emits light. Since the luminescent peak wavelength in the luminescent layer and the luminescent peak wavelength in the luminescent portion differ from each other, light is emitted in different colors, respectively, in the region where no luminescent portion is provided and the region where the luminescent portion is provided. Therefore, various images can be displayed by forming the luminescent portion in a suitable shape such as a character or a picture.

As the first organic EL device according to the present invention, an organic EL device having an SH-A structure in which a hole transporting layer and a luminescent layer having electron transporting characteristics are provided between a hole injection electrode and an electron injection electrode and an organic EL device having an SH-B structure in which a luminescent layer having hole transporting characteristics and an electron transporting layer are provided therebetween, wherein a luminescent portion having a luminescent peak wavelength different from a luminescent peak wavelength in the luminescent layer is partially provided in such a manner that it is laminated on the luminescent layer, are more preferable than an organic EL device having a DH structure in which a hole transporting layer, a luminescent layer and an electron transporting layer are provided between a hole injection electrode and an electron injection electrode, wherein a luminescent portion having a luminescent peak wavelength different from a luminescent peak wavelength in the luminescent layer is partially provided in such a manner that it is laminated on the luminescent layer. Specifically, in the above-mentioned organic EL device having the SH-A structure or the SH-B structure, the device structure is simpler and the fabrication is easier, and electrons and holes can be injected into the luminescent portion more efficiently, whereby light having sufficient luminance is emitted in the luminescent portion, as compared with the organic EL device having a DH structure.

In the first organic EL device, when the luminescent peak wavelength of light emitted in the luminescent portion is made longer than the luminescent peak wavelength of light emitted in the luminescent layer, there is little possibility that the light emitted in the luminescent portion is absorbed by the luminescent layer and therefore, is reduced, whereby light having sufficient luminance is emitted from the luminescent portion.

Furthermore, in the first organic EL device, a material having a large work function such as gold or ITO (an indium-tin oxide) is used for the hole injection electrode, while an electrode material having a small work function such as magnesium is used for the electron injection electrode. In order to take out EL light, at least one of the electrodes must be made transparent. Transparent ITO having a large work function is generally used for the hole injection electrode.

Additionally, in the first organic EL device, when there are provided several types of luminescent portions having luminescent peak wavelengths different from that in the luminescent layer, the color of light emitted in the luminescent layer and the color of light emitted in each of the luminescent portions can be changed, whereby multicolor display and full-color display can be performed.

In an organic EL device having at least a hole transporting layer having luminous characteristics and an electron transporting layer having luminous characteristics which respectively contain organic materials emitting fluorescence in different colors in a visible region provided between a hole injection electrode and an electron injection electrode, a second organic EL device according to the present invention is characterized in that when the hole transporting layer having luminous characteristics emits light, a hole transporting portion having non-luminous characteristics is partially provided between the hole transporting layer having luminous characteristics and the electron transporting layer having luminous characteristics.

As in the second organic EL device, in a case where the hole transporting layer having luminous characteristics emits light, when the hole transporting portion having non-luminous characteristics is partially provided between the hole transporting layer having luminous characteristics and the electron transporting layer having luminous characteristics, electrons are prevented from being injected in the hole transporting layer having luminous characteristics by the hole transporting portion having non-luminous characteristics, not the hole transporting layer having luminous characteristics but the electron transporting layer having luminous characteristics emits light. Therefore, fluorescence is emitted in different colors, respectively, in the region where no hole transporting portion having non-luminous characteristics is provided and the region where the hole transporting portion having non-luminous characteristics is provided.

In an organic electroluminescent device having at least a hole transporting layer having luminous characteristics and an electron transporting layer having luminous characteristics which respectively contain organic materials emitting fluorescence in different colors in a visible region provided between a hole injection electrode and an electron injection electrode, a third organic EL device according to the present invention is characterized in that when the electron transporting layer having luminous characteristics emits light, an electron transporting portion having non-luminous characteristics is partially provided between the electron transporting layer having luminous characteristics and the hole transporting layer having luminous characteristics.

As in the third organic EL device, in a case where the electron transporting layer having luminous characteristics emits light, when the electron transporting portion having non-luminous characteristics is partially provided between the electron transporting layer having luminous characteristics and the hole transporting layer having luminous characteristics, holes are prevented from being injected into the electron transporting layer having luminous characteristics by the electron transporting portion having non-luminous characteristics, whereby not the electron transporting layer having luminous characteristics but the hole transporting layer having luminous characteristics emits light. Therefore, fluorescence is emitted in different colors, respectively, in a region where no electron transporting portion having non-luminous characteristics is provided and a region where the electron transporting portion having non-luminous characteristics is provided.

In an organic EL device having at least a hole transporting layer having luminous characteristics, a luminescent layer, and an electron transporting layer having luminous characteristics which respectively contain organic materials emitting fluorescence in different colors in a visible region provided between a hole injection electrode and an electron injection electrode, a fourth organic EL device according to the present invention is characterized in that an electron transporting portion having non-luminous characteristics is partially provided between the hole transporting layer having luminous characteristics and the luminescent layer and/or a hole transporting portion having non-luminous characteristics is partially provided between the luminescent layer and the electron transporting layer having luminous characteristics.

As in the fourth organic EL device, when the electron transporting portion having non-luminous characteristics is partially provided between the hole transporting layer having luminous characteristics and the luminescent layer, holes are prevented from being injected into the luminescent layer by the electron transporting portion having non-luminous characteristics, whereby not the luminescent layer but the hole transporting layer having luminous characteristics emits light.

When the hole transporting portion having non-luminous characteristics is partially provided between the luminescent layer and the electron transporting layer having luminous characteristics, electrons are prevented from being injected into the luminescent layer by the hole transporting portion having non-luminous characteristics, whereby not the luminescent layer but the electron transporting layer having luminous characteristics emits light.

In the fourth organic EL device, therefore, the hole transporting layer having luminous characteristics emits light in the region where the electron transporting portion having non-luminous characteristics is provided, the electron transporting layer having luminous characteristics emits light in the region where the hole transporting portion having non-luminous characteristics is provided, and the luminescent layer emits light in a region where no electron transporting portion having non-luminous characteristics and no hole transporting portion having non-luminous characteristics are provided, whereby fluorescence is obtained in three different colors.

In each of the above-mentioned second to fourth organic EL devices, various images in different colors can be displayed by providing the electron transporting portion having non-luminous characteristics and the hole transporting portion having non-luminous characteristics in suitable shapes. Particularly in the fourth organic EL device, the region where the hole transporting portion having non-luminous characteristics is provided, the region where the electron transporting portion having non-luminous characteristics is provided, and the region where no hole transporting portion having non-luminous characteristics and no electron transporting portion having non-luminous characteristics are provided, are respectively provided in suitable positions, whereby multicolor display and full-color display can be performed.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Organic EL devices according to embodiments of the present invention will be specifically described on the basis of attached drawings.

(Embodiment 1)

Figure 1:
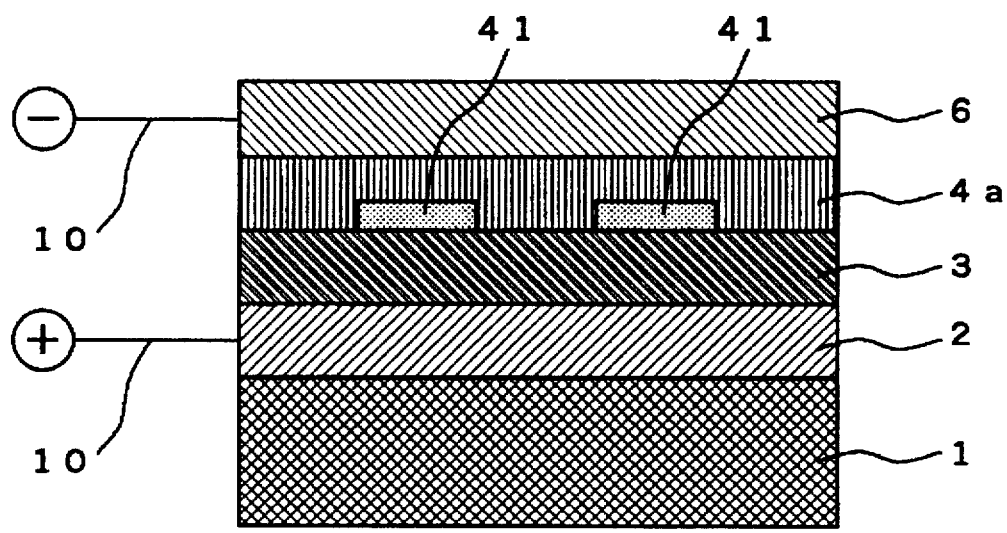
FIG. 1 is a schematic cross-sectional view showing a device structure of each of organic EL devices in embodiments 1, 3, 5, 7 and 9 of the present invention.

An organic EL device in the present embodiment has a structure in which a transparent hole injection electrode 2 having a thickness of 200 Å is formed using an indium-tin oxide (hereinafter referred to as ITO) on a glass substrate 1, a hole transporting layer 3 having a thickness of 500 Å is formed using a hole transporting material composed of N,N'-diphenyl-N,N'-bis(3-methylphenyl)-1,1'-biphenyl-4, 4'-diamine (hereinafter referred to as MTPD) indicated by the following chemical formula 1 on the hole injection electrode 2, luminescent portions 41 having a thickness of 100 Å are partially formed using a luminescent material composed of rubrene indicated by the following chemical formula 2 on the hole transporting layer 3, a luminescent layer 4a having electron transporting characteristics which has a thickness of 500 Å is formed using a luminescent material having electron transporting characteristics composed of tris(8-hydroxyquinoline) aluminum (hereinafter referred to as Alq3) indicated by the following chemical formula 3 on the hole transporting layer 3 on which the luminescent portions 41 are partially formed, and an electron injection electrode 6 having a thickness of 2000 Å is further formed using a magnesium-indium alloy on the luminescent layer 4a, as shown in FIG. 1.

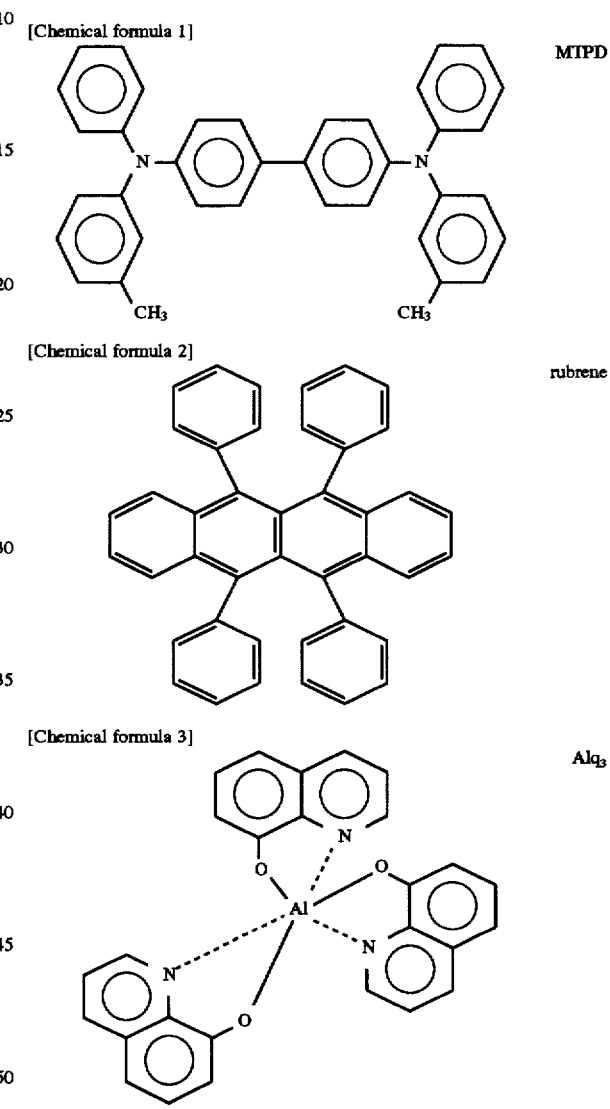

[Chemical formula 1] MTPD

[Chemical formula 2] rubrene

[Chemical formula 3] Alq₃

Lead wires 10 are respectively connected to the hole injection electrode 2 and the electron injection electrode 6, to apply positive and negative bias voltages to the hole injection electrode 2 and the electron injection electrode 6.

Description is now made of a method of fabricating the organic EL device in the present embodiment.

A glass substrate 1 on which a hole injection electrode 2 composed of ITO is formed was first cleaned by a neutral detergent, and was then ultrasonically cleaned, respectively, in acetone for twenty minutes and in ethanol for twenty minutes. The above-mentioned MTPD was then vacuum evaporated on the hole injection electrode 2 formed on the glass substrate 1, to form a hole transporting layer 3. The above-mentioned rubrene was vacuum evaporated using a metal mask on a part of the hole transporting layer 3, to form luminescent portions 41, after which the above-mentioned Alq3 was vacuum evaporated on the luminescent portions 41 and the hole transporting layer 3 having no luminescent portions 41 formed therein, to form a luminescent layer 4a having electron transporting characteristics, and an electron injection electrode 6 composed of a magnesium-indium alloy was further formed by vacuum evaporation on the luminescent layer 4a. The vacuum evaporation was performed by a resistance heating method using a molybdenum boat and under conditions such as a degree of vacuum of not more than $1 \times 10^{-5}$ Torr and a substrate temperature of 20° to 30° C.

When a voltage of 10 V is applied between the hole injection electrode 2 and the electron injection electrode 6 in the organic EL device according to the present embodiment, yellow light having luminance of 1000 cd/m$^2$ and having a luminescent peak wavelength of 560 nm is emitted in a region where the luminescent portions 41 are formed, while green light having luminance of 1500 cd/m$^2$ and having a luminescent peak wavelength of 520 nm is emitted in a region where no luminescent portions 41 are formed, to make it possible to simultaneously emit the yellow light and the green light. It is confirmed by an emission spectrum that the yellow light in the region where the luminescent portions 41 are formed is emitted by the rubrene used for the luminescent portions 41, and the green light in the region where no luminescent portions 41 are formed is emitted by the Alq3 used for the luminescent layer 4a.

(Embodiment 2)

Figure 2:
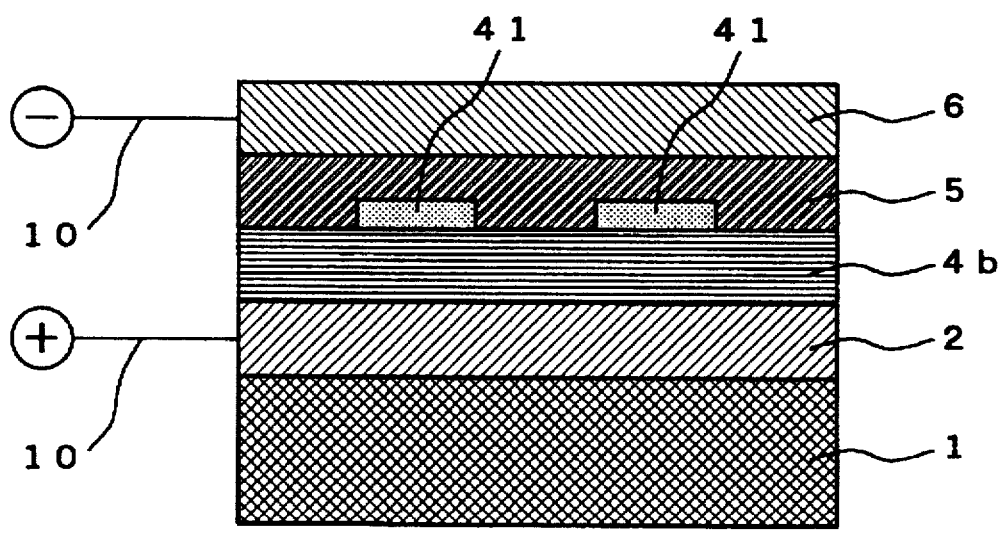
FIG. 2 is a schematic cross-sectional view showing a device structure of each of organic EL devices in embodiments 2, 4, 6, 8 and 10 of the present invention.

In an organic EL device in the present embodiment, a transparent hole injection electrode 2 having a thickness of 2000 Å is formed using ITO on a glass substrate 1, a luminescent layer 4b having hole transporting characteristics which has a thickness of 500 Å is formed using a luminescent material having hole transporting characteristics composed of a pyrazoline compound (hereinafter referred to as PYR-9) indicated by the following chemical formula 4 on the hole injection electrode 2, luminescent portions 41 having a thickness of 100 Å are partially formed using the above-mentioned rubrene on the luminescent layer 4b, an electron transporting layer 5 having a thickness of 500 Å is formed using an electron transporting material composed of an oxadiazole compound (hereinafter referred to as OXD-7) indicated by the following chemical formula 5 on the luminescent layer 4b on which the luminescent portions 41 are partially formed, and an electron injection electrode 6 having a thickness of 2000 Å is further formed using a magnesium-indium alloy on the electron transporting layer 5, as shown in FIG. 2.

When a voltage of 10 V is applied between the hole injection electrode 2 and the electron injection electrode 6 in the organic EL device according to the present embodiment, yellow light having luminance of 1000 cd/m$^2$ and having a luminescent peak wavelength of 560 nm is emitted in a region where the luminescent portions 41 are formed, while bluish-green light having luminance of 2000 cd/m$^2$ and having a luminescent peak wavelength of 490 nm is emitted in a region where no luminescent portions 41 are formed, to make it possible to simultaneously emit the yellow light and the bluish-green light. It is confirmed by an emission spectrum that the yellow light in the region where the luminescent portions 41 are formed is emitted by the rubrene used for the luminescent portions 41, and the bluish-green light in the region where no luminescent portions 41 are formed is emitted by the PYR-9 used for the luminescent layer 4b.

(Embodiment 3)

In the present embodiment 3, an organic EL device is obtained in the same manner as the organic EL device in the above-mentioned embodiment 1 except that a hole transporting layer 3 is formed using N,N'-diphenyl-N,N'-bis(4-methylphenyl)-1,1'-biphenyl-4,4'-diamine (hereinafter referred to as PTPD) indicated by the following chemical formula 6 as a hole transporting material, and the above-mentioned MTPD which is a hole transporting material and the above-mentioned rubrene are co-evaporated on the hole transporting layer 3 in such a manner that 5% by weight of the rubrene is contained in the MTPD, to partially form luminescent portions 41.

[Chemical formula 6]

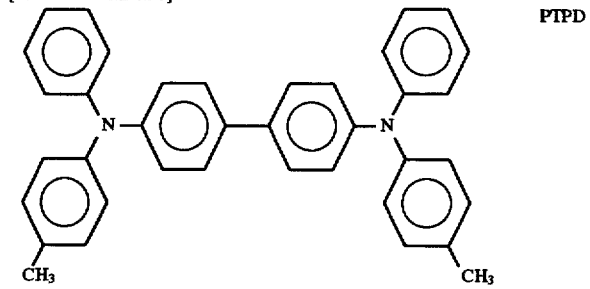

PTPD

When a voltage of 10 V is applied between a hole injection electrode 2 and an electron injection electrode 6 in the organic EL device according to the present embodiment, yellow light having luminance of 1500 cd/m$^2$ and having a luminescent peak wavelength of 560 nm is emitted in a region where the luminescent portions 41 are formed, while green light having luminance of 1600 cd/m$^2$ and having a luminescent peak wavelength of 520 nm is emitted in a

[Chemical formula 4]

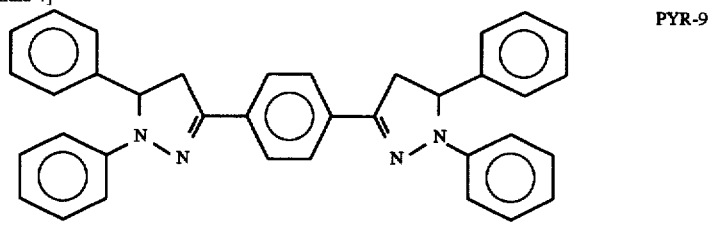

PYR-9

[Chemical formula 5]

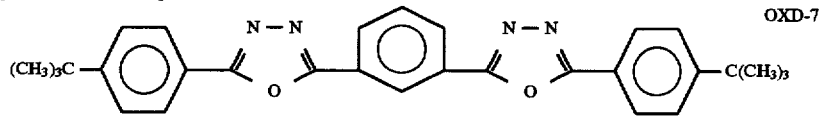

OXD-7 region where no luminescent portions 41 are formed, to make it possible to simultaneously emit the yellow light and the green light. It is confirmed by an emission spectrum that the yellow light in the region where the luminescent portions 41 are formed is emitted by the rubrene used for the luminescent portions 41, and the green light in the region where no luminescent portions 41 are formed is emitted by Alq3 used for a luminescent layer 4a.

(Embodiment 4)

In the present embodiment 4, an organic EL device is obtained in the same manner as the organic EL device in the above-mentioned embodiment 2 except that the above-mentioned MTPD which is a hole transporting material and the above-mentioned rubrene are co-evaporated on a luminescent layer 4b having hole transporting characteristics using the PYR-9 in such a manner that 5% by weight of the rubrene is contained in the MTPD, to partially form luminescent portions 41.

When a voltage of 10 V is applied between a hole injection electrode 2 and an electron injection electrode 6 in the organic EL device according to the present embodiment, yellow light having luminance of 1500 cd/m² and having a luminescent peak wavelength of 560 nm is emitted in a region where the luminescent portions 41 are formed, while bluish-green light having luminance of 2000 cd/m² and having a luminescent peak wavelength of 490 nm is emitted in a region where no luminescent portions 41 are formed, to make it possible to simultaneously emit the yellow light and the bluish-green light. It is confirmed by an emission spectrum that the yellow light in the region where the luminescent portions 41 are formed is emitted by the rubrene used for the luminescent portions 41, and the bluish-green light in the region where no luminescent portions 41 are formed is emitted by the PYR-9 used for the luminescent layer 4b.

(Embodiment 5)

In the present embodiment 5, an organic EL device is obtained in the same manner as the organic EL device in the above-mentioned embodiment 1 except that the above-mentioned MTPD which is used for a hole transporting layer 3 and the above-mentioned rubrene are co-evaporated on the hole transporting layer 3 in such a manner that 5% by weight of the rubrene is contained in the MTPD, to partially form luminescent portions 41.

When a voltage of 10 V is applied between a hole injection electrode 2 and an electron injection electrode 6 in the organic EL device according to the present embodiment, yellow light having luminance of 1300 cd/m² and having a luminescent peak wavelength of 560 nm is emitted in a region where the luminescent portions 41 are formed, while green light having luminance of 1500 cd/m² and having a luminescent peak wavelength of 520 nm is emitted in a region where no luminescent portions 41 are formed, to make it possible to simultaneously emit the yellow light and the green light. It is confirmed by an emission spectrum that the yellow light in the region where the luminescent portions 41 are formed is emitted by the rubrene used for the luminescent portions 41, and the green light in the region where no luminescent portions 41 are formed is emitted by the Alq3 used for a luminescent layer 4a.

(Embodiment 6)

In the present embodiment 6, an organic EL device is obtained in the same manner as the organic EL device in the above-mentioned embodiment 2 except that the above-mentioned PYR-9 which is used for a luminescent layer 4b having hole transporting characteristics and the above-mentioned rubrene are co-evaporated on the luminescent layer 4b in such a manner that 5% by weight of the rubrene is contained in the PYR-9, to partially form luminescent portions 41.

When a voltage of 10 V is applied between a hole injection electrode 2 and an electron injection electrode 6 in the organic EL device according to the present embodiment, yellow light having luminance of 1500 cd/m² and having a luminescent peak wavelength of 560 nm is emitted in a region where the luminescent portions 41 are formed, while bluish-green light having luminance of 2000 cd/m² and having a luminescent peak wavelength of 490 nm is emitted in a region where no luminescent portions 41 are formed, to make it possible to simultaneously emit the yellow light and the bluish-green light. It is confirmed by an emission spectrum that the yellow light in the region where the luminescent portions 41 are formed is emitted by the rubrene used for the luminescent portions 41, and the bluish-green light in the region where no luminescent portions 41 are formed is emitted by the PYR-9 used for the luminescent layer 4b.

(Embodiment 7)

In the present embodiment 7, an organic EL device is obtained in the same manner as the organic EL device in the above-mentioned embodiment 1 except that the above-mentioned Alq3 having electron transporting characteristics and the above-mentioned rubrene are co-evaporated on a hole transporting layer 3 in such a manner that 5% by weight of the rubrene is contained in the Alq3, to partially form luminescent portions 41, and a luminescent layer 4a having electron transporting characteristics is formed using a luminescent material having electron transporting characteristics composed of (10-Hydroxybenzo[h]quinolinate)beryllium (hereinafter referred to as BeBq2) indicated by the following chemical formula 7 on the luminescent portions 41 and the hole transporting layer 3 having no luminescent portions 41 provided therein.

[Chemical formula 7]

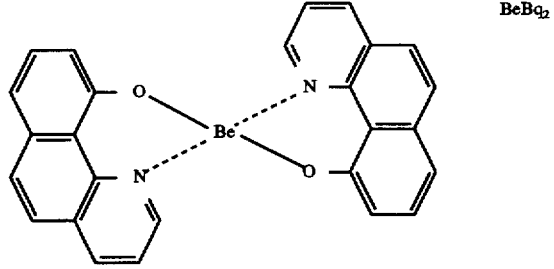

BeBq₂

When a voltage of 10 V is applied between a hole injection electrode 2 and an electron injection electrode 6 in the organic EL device according to the present embodiment, yellow light having luminance of 800 cd/m² and having a luminescent peak wavelength of 560 nm is emitted in a region where the luminescent portions 41 are formed, while green light having luminance of 1500 cd/m² and having a luminescent peak wavelength of 520 nm is emitted in a region where no luminescent portions 41 are formed, to make it possible to simultaneously emit the yellow light and the green light. It is confirmed by an emission spectrum that the yellow light in the region where the luminescent portions 41 are formed is emitted by the rubrene used for the luminescent portions 41, and the green light in the region where no luminescent portions 41 are formed is emitted by the BeBq2 used for the luminescent layer 4a.

(Embodiment 8)

In the present embodiment 8, an organic EL device is obtained in the same manner as the organic EL device in the above-mentioned embodiment 2 except that the above-mentioned Alq3 having electron transporting characteristics and the above-mentioned rubrene are co-evaporated on a luminescent layer 4b having hole transporting characteristics using the PYR-9 in such a manner that 5% by weight of the rubrene is contained in the Alq3, to partially form luminescent portions 41.

When a voltage of 10 V is applied between a hole injection electrode 2 and an electron injection electrode 6 in the organic EL device according to the present embodiment, yellow light having luminance of 800 cd/m² and having a luminescent peak wavelength of 560 nm is emitted in a region where the luminescent portions 41 are formed, while bluish-green light having luminance of 2000 cd/m² and having a luminescent peak wavelength of 490 nm is emitted in a region where no luminescent portions 41 are formed, to make it possible to simultaneously emit the yellow light and the bluish-green light. It is confirmed by an emission spectrum that the yellow light in the region where the luminescent portions 41 are formed is emitted by the rubrene used for the luminescent portions 41, and the bluish-green light in the region where no luminescent portions 41 are formed is emitted by the PYR-9 used for the luminescent layer 4b.

(Embodiment 9)

In the present embodiment 9, an organic EL device is obtained in the same manner as the organic EL device in the above-mentioned embodiment 1 except that the above-mentioned Alq3 which is used for a luminescent layer 4a having electron transporting characteristics and the above-mentioned rubrene are co-evaporated on a hole transporting layer 3 in such a manner that 5% by weight of the rubrene is contained in the Alq3, to partially form luminescent portions 41.

When a voltage of 10 V is applied between a hole injection electrode 2 and an electron injection electrode 6 in the organic EL device according to the present embodiment, yellow light having luminance of 700 cd/m² and having a luminescent peak wavelength of 560 nm is emitted in a region where the luminescent portions 41 are formed, while green light having luminance of 1500 cd/m² and having a luminescent peak wavelength of 520 nm is emitted in a region where no luminescent portions 41 are formed, to make it possible to simultaneously emit the yellow light and the green light. It is confirmed by an emission spectrum that the yellow light in the region where the luminescent portions 41 are formed is emitted by the rubrene used for the luminescent portions 41, and the green light in the region where no luminescent portions 41 are formed is emitted by the Alq3 used for the luminescent layer 4a.

(Embodiment 10)

In the present embodiment 10, an organic EL device is obtained in the same manner as the organic EL device in the above-mentioned embodiment 2 except that the above-mentioned OXD-7 which is used for an electron transporting layer 5 and the above-mentioned rubrene are co-evaporated on a luminescent layer 4b having hole transporting characteristics using the PYR-9 in such a manner that 5% by weight of the rubrene is contained in the OXD-7, to partially form luminescent portions 41.

When a voltage of 10 V is applied between a hole injection electrode 2 and an electron injection electrode 6 in the organic EL device according to the present embodiment, yellow light having luminance of 800 cd/m² and having a luminescent peak wavelength of 560 nm is emitted in a region where the luminescent portions 41 are formed, while bluish-green light having luminance of 2000 cd/m² and having a luminescent peak wavelength of 490 nm is emitted in a region where no luminescent portions 41 are formed, to make it possible to simultaneously emit the yellow light and the bluish-green light. It is confirmed by an emission spectrum that the yellow light in the region where the luminescent portions 41 are formed is emitted by the rubrene used for the luminescent portions 41, and the bluish-green light in the region where no luminescent portions 41 are formed is emitted by the PYR-9 used for the luminescent layer 4b.

(Embodiment 11)

Figure 3:
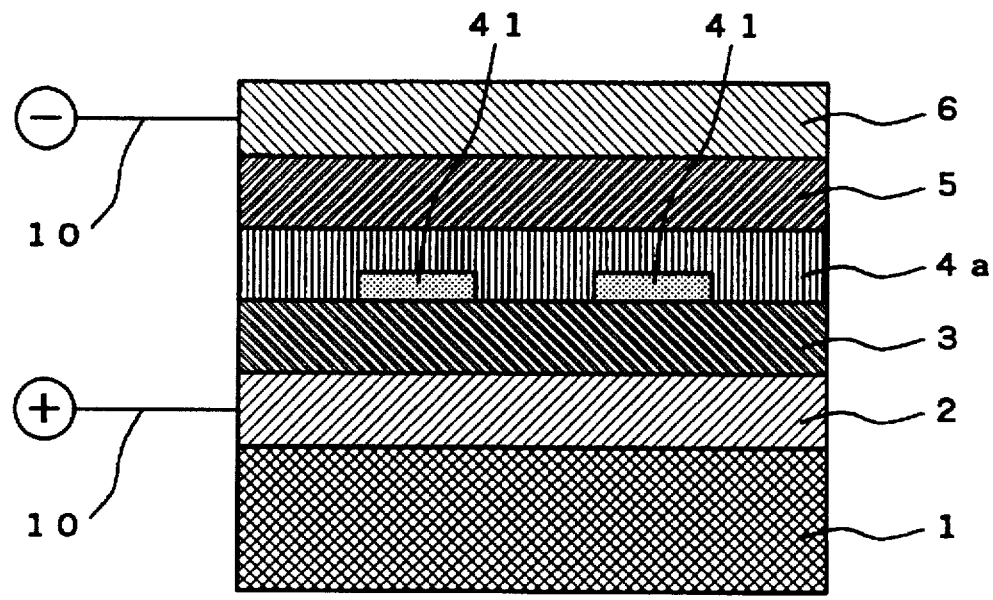
FIG. 3 is a schematic cross-sectional view showing a device structure of an organic EL device in an embodiment 11 of the present invention.

An organic EL device in the present embodiment has a structure in which a transparent hole injection electrode 2 having a thickness of 2000 Å composed of ITO is formed on a glass substrate 1, a hole transporting layer 3 having a thickness of 500 Å is formed using the above-mentioned MTPD on the hole injection electrode 2, luminescent portions 41 having a thickness of 100 Å are partially formed using a luminescent material composed of the above-mentioned rubrene on the hole transporting layer 3, a luminescent layer 4a having electron transporting characteristics which has a thickness of 100 Å is formed using a luminescent material having electron transporting characteristics composed of 1AZM-Hex indicated by the following chemical formula 8 on the hole transporting layer 3 on which the luminescent portions 41 are partially formed, an electron transporting layer 5 having a thickness of 500 Å is formed using the above-mentioned OXD-7 on the luminescent layer 4a, and an electron injection electrode 6 having a thickness of 2000 Å is further formed using a magnesium-indium alloy on the electron transporting layer 5, as shown in FIG. 3.

[Chemical formula 8]

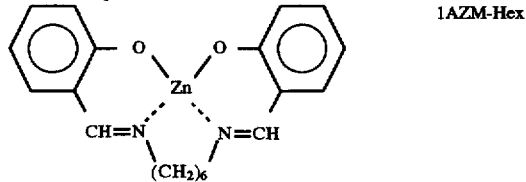

Lead wires 10 are respectively connected to the hole injection electrode 2 and the electron injection electrode 6, to apply positive and negative bias voltages to the hole injection electrode 2 and the electron injection electrode 6.

Description is now made of a method of fabricating the organic EL device in the present embodiment.

A glass substrate 1 on which a hole injection electrode 2 composed of ITO is formed was first cleaned by a neutral detergent, and was then ultrasonically cleaned, respectively, in acetone for twenty minutes and in ethanol for twenty minutes. The above-mentioned MTPD was then vacuum evaporated on the hole injection electrode 2 formed on the glass substrate 1, to form a hole transporting layer 3. The above-mentioned rubrene was vacuum evaporated using a metal mask on a part of the hole transporting layer 3, to form luminescent portions 41, after which the above-mentioned 1AZM-Hex was vacuum evaporated on the luminescent portions 41 and the hole transporting layer 3 having no luminescent portions 41 formed therein, to form a luminescent layer 4a having electron transporting characteristics, the above-mentioned OXD-7 was vacuum evaporated on the luminescent layer 4a, to form an electron transporting layer 5, and an electron injection electrode 6 composed of a magnesium-indium alloy was further formed by vacuum evaporation on the electron transporting layer 5. The vacuum evaporation was performed by a resistance heating method using a molybdenum boat and under conditions such as a degree of vacuum of not more than 1×10⁻⁵ Torr and a substrate temperature of 20° to 30° C.

When a voltage of 10 V is applied between the hole injection electrode 2 and the electron injection electrode 6 in the organic EL device according to the present embodiment, yellow light having luminance of 500 cd/m² and having a luminescent peak wavelength of 560 nm is emitted in a region where the luminescent portions 41 are formed, while blue light having luminance of 800 cd/m² and having a luminescent peak wavelength of 460 nm is emitted in a region where no luminescent portions 41 are formed, to make it possible to simultaneously emit the yellow light and the blue light. It is confirmed by an emission spectrum that the yellow light in the region where the luminescent portions 41 are formed is emitted by the rubrene used for the luminescent portions 41, and the blue light in the region where no luminescent portions 41 are formed is emitted by the 1AZM-Hex used for the luminescent layer 4a.

(Embodiment 12)

Figure 4:
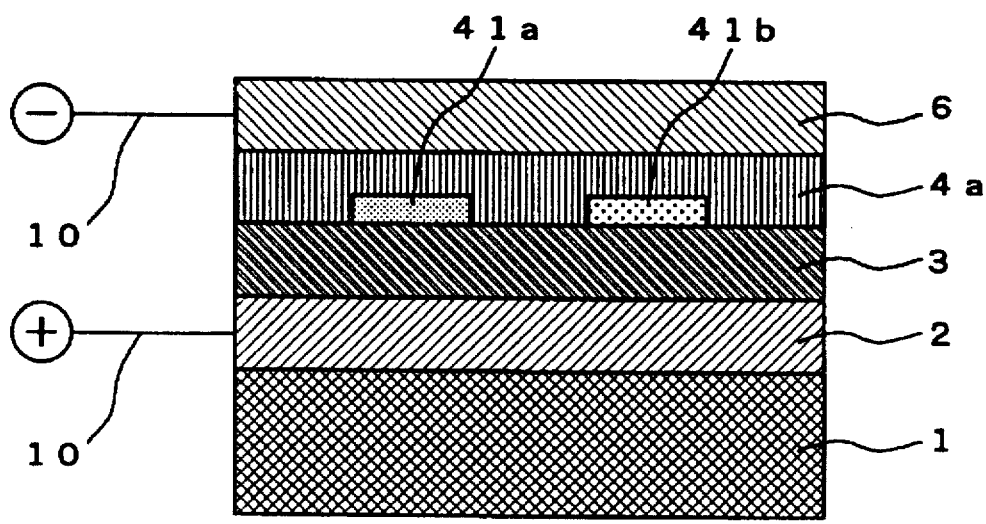
FIG. 4 is a schematic cross-sectional view showing a device structure of an organic EL device in an embodiment 12 of the present invention.

An organic EL device in the present embodiment has a structure in which a transparent hole injection electrode 2 having a thickness of 2000 Å composed of ITO is formed on a glass substrate 1, a hole transporting layer 3 having a thickness of 500 Å is formed using the above-mentioned MTPD on the hole injection electrode 2, first luminescent portions 41a having a thickness of 100 Å are partially formed using a luminescent material having electron transporting characteristics composed of the above-mentioned Alq3 on a part of the hole transporting layer 3, second luminescent portions 41b having a thickness of 100 Å in which 5% by weight of Eu(TTA)3phen indicated by the following chemical formula 9 is contained in the above-mentioned 1AZM-Hex are partially formed on the other part of the hole transporting layer 3, a luminescent layer 4a having electron transporting characteristics having a thickness of 500 Å is formed using a luminescent material having electron transporting characteristics composed of the 1AZM-Hex on the first and second luminescent portions 41a and 41b and the hole transporting layer 3, and an electron injection electrode 6 having a thickness of 2000 Å is further formed using a magnesium-indium alloy on the luminescent layer 4a, as shown in FIG. 4.

[Chemical formula 9]

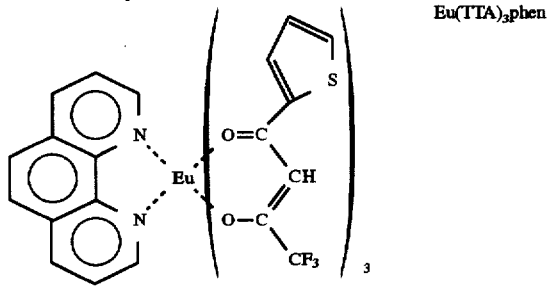

Eu(TTA)₃phen

Lead wires 10 are respectively connected to the hole injection electrode 2 and the electron injection electrode 6, to apply positive and negative bias voltages to the hole injection electrode 2 and the electron injection electrode 6.

Description is now made of a method of fabricating the organic EL device in the present embodiment.

A glass substrate 1 on which a hole injection electrode 2 composed of ITO is formed was first cleaned by a neutral detergent, and was then ultrasonically cleaned, respectively, in acetone for twenty minutes and in ethanol for twenty minutes. The above-mentioned MTPD was then vacuum evaporated on the hole injection electrode 2 formed on the glass substrate 1, to form a hole transporting layer 3. The above-mentioned Alq3 was vacuum evaporated using a metal mask on a part of the hole transporting layer 3, to partially form first luminescent portions 41a, after which the 1AZM-Hex and the Eu(TTA)3phen were co-evaporated on a part of the hole transporting layer 3 having no first luminescent portions 41a formed therein in such a manner that 5% by weight of the Eu(TTA)3phen is contained in the 1AZM-Hex, to partially form second luminescent portions 41b. The above-mentioned 1AZM-Hex was vacuum evaporated on the first and second luminescent portions 41a and 41b and the hole transporting layer 3 having no luminescent portions 41a and 41b formed therein, to form a luminescent layer 4a having electron transporting characteristics, and an electron injection electrode 6 composed of a magnesium-indium alloy was further formed by vacuum evaporation on the luminescent layer 4a. The vacuum evaporation was performed by a resistance heating method using a molybdenum boat and under conditions such as a degree of vacuum of not more than 1×10⁻⁵ Torr and a substrate temperature of 20° to 30° C.

When a voltage of 12 V is applied between the hole injection electrode 2 and the electron injection electrode 6 in the organic EL device according to the present embodiment, green light having luminance of 800 cd/m², having a luminescent peak wavelength of 520 nm, and having x=0.33 and y=0.60 in CIE chromaticity coordinates is emitted in a region where the first luminescent portions 41a are formed, red light having luminance of 100 cd/m², having a luminescent peak wavelength of 615 nm, having x=0.66 and y=0.33 in CIE chromaticity coordinates is emitted in a region where the second luminescent portions 41b are formed, and blue light having luminance of 1000 cd/m², having a luminescent peak wavelength of 460 nm, and having x=0.10 and y=0.12 in CIE chromaticity coordinates is emitted in a region where no luminescent portions 41a and 41b are provided, thereby to make it possible to simultaneously emit the light in the three primary colors, green, red and blue. It is confirmed by an emission spectrum that the green light in the region where the first luminescent portions 41a are formed is emitted by the Alq3 used for the first luminescent portions 41a, the red light in the region where the second luminescent portions 41b are formed is emitted by the Eu(TTA)3phen used for the second luminescent portions 41b, and the blue light in the region where no luminescent portions 41a and 41b are formed is emitted by the 1AZM-Hex used for the luminescent layer 4a.

(Embodiment 13)

Figure 5:
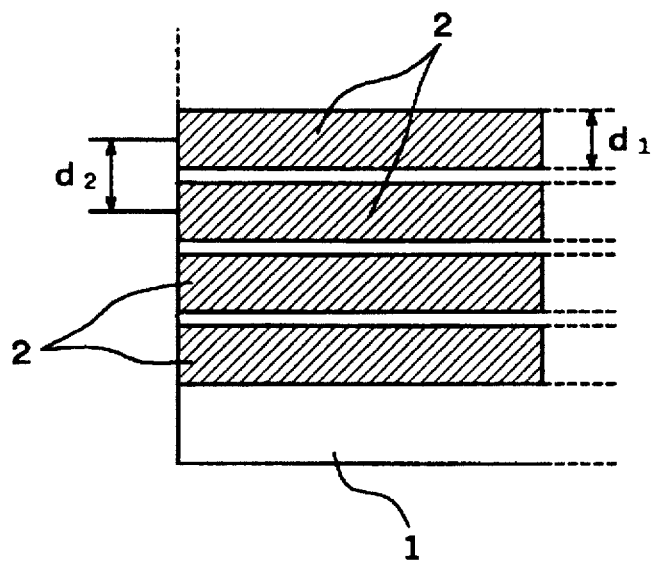
FIG. 5 is a plan view showing a state where a hole injection electrode is formed in a stripe shape on a glass substrate in fabricating an organic EL device in an embodiment 13 of the present invention.

In fabricating an organic EL device in the present embodiment, a hole injection electrode 2 composed of ITO was formed on a glass substrate 1 in a stripe shape in such a manner that the line width d1 is 0.4 mm and the center-to-center pitch d2 is 0.5 mm, after which the hole injection electrode 2 was cleaned by a neutral detergent, and was further ultrasonically cleaned, respectively, in acetone for twenty minutes and in ethanol for twenty minutes, as shown in FIG. 5.

Figure 6:
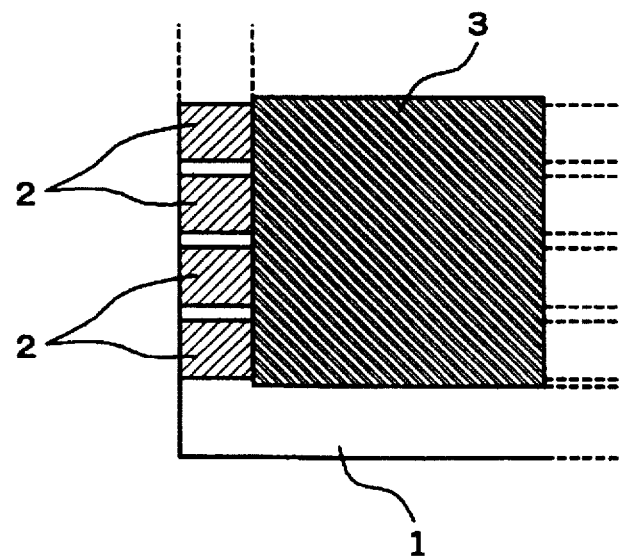
FIG. 6 is a plan view showing a state where a hole transporting layer is formed on the hole injection electrode in fabricating the organic EL device in the embodiment 13.

As shown in FIG. 6, the above-mentioned MTPD was then vacuum evaporated on the glass substrate 1 on which the hole injection electrode 2 is formed, to from a hole transporting layer 3.

Figure 7:
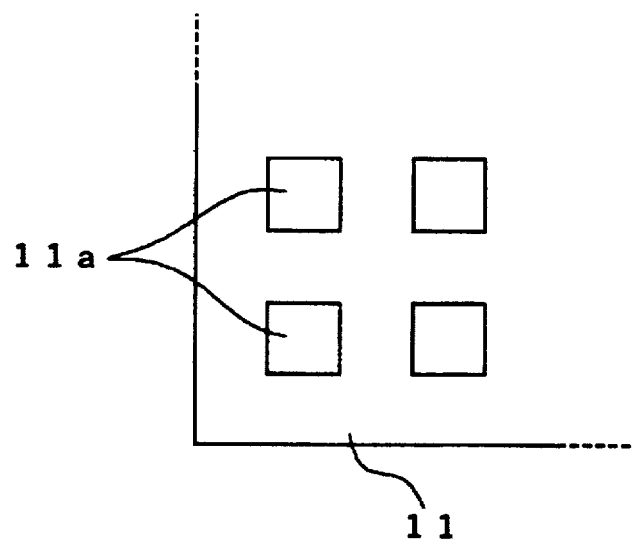
FIG. 7 is a plan view of a metal mask used for fabricating the organic EL device in the embodiment 13.
Figure 8:
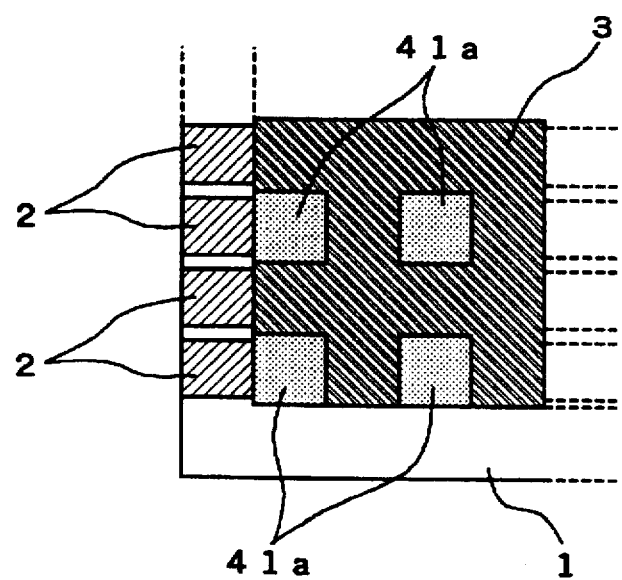
FIG. 8 is a plan view showing a state where first luminescent portions are partially formed using the metal mask on the hole transporting layer in fabricating the organic EL device in the embodiment 13.

A metal mask 11 having holes 11a 0.5 mm square arranged at a pitch of 0.5 mm in the longitudinal and transverse directions was used, as shown in FIG. 7, and the above-mentioned Alq3 was vacuum evaporated on the above-mentioned hole transporting layer 3 in such a manner that the center of each of the holes 11a 0.5 mm square in the metal mask 11 and the center of the stripe of the hole injection electrode 2 are overlapped with each other, to form first luminescent portions 41a respectively corresponding to portions of the holes 11a in the metal mask 11, as shown in FIG. 8.

Figure 9:
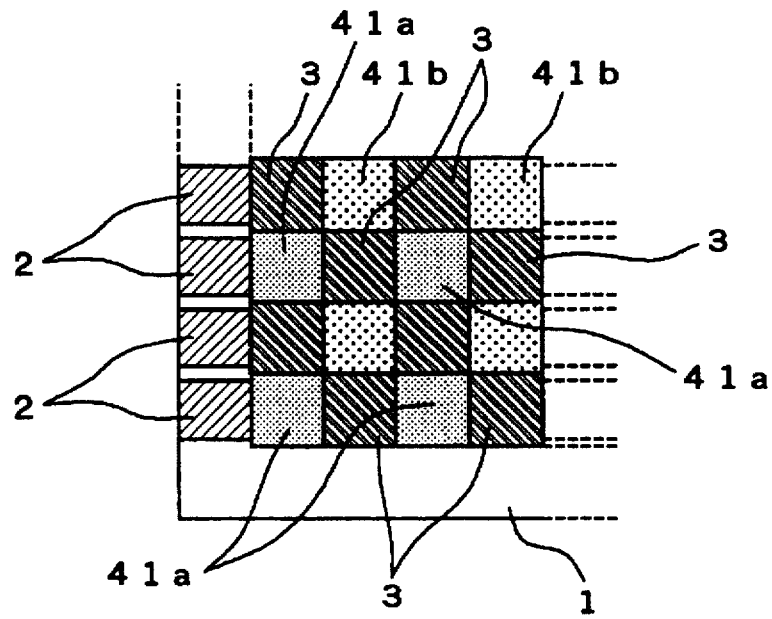
FIG. 9 is a plan view showing a state where second luminescent portions are partially formed using the metal mask on the hole transporting layer in fabricating the organic EL device in the embodiment 13.

The position of each of the holes 11a 0.5 mm square in the metal mask 11 was then shifted, and the above-mentioned 1AZM-Hex and Eu(TTA)3phen were co-evaporated on the hole transporting layer 3 in such a manner that 5% by weight of the Eu(TTA)3phen is contained in the 1AZM-Hex, to form second luminescent portions 41b respectively corresponding to the holes 11a in the metal mask 11, as shown in FIG. 9, in such a manner that the center of each of the holes 11a 0.5 mm square is overlapped with the center of the stripe of the hole injection electrode 2 having no first luminescent portions 41a formed therein, and the holes 11a in the metal mask 11 are arranged in a checker shape with respect to the above-mentioned first luminescent portions 41a and each of the holes 11a is positioned in the center of a square formed by the four first luminescent portions 41a.

Figure 10:
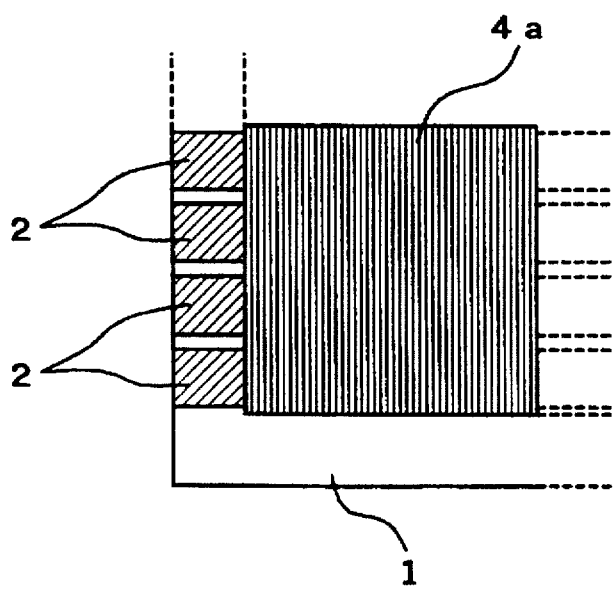
FIG. 10 is a plan view showing a state where a luminescent layer having electron transporting characteristics is formed on the hole transporting layer having first and second luminescent portions formed therein in fabricating the organic EL device in the embodiment 13.
Figure 11:
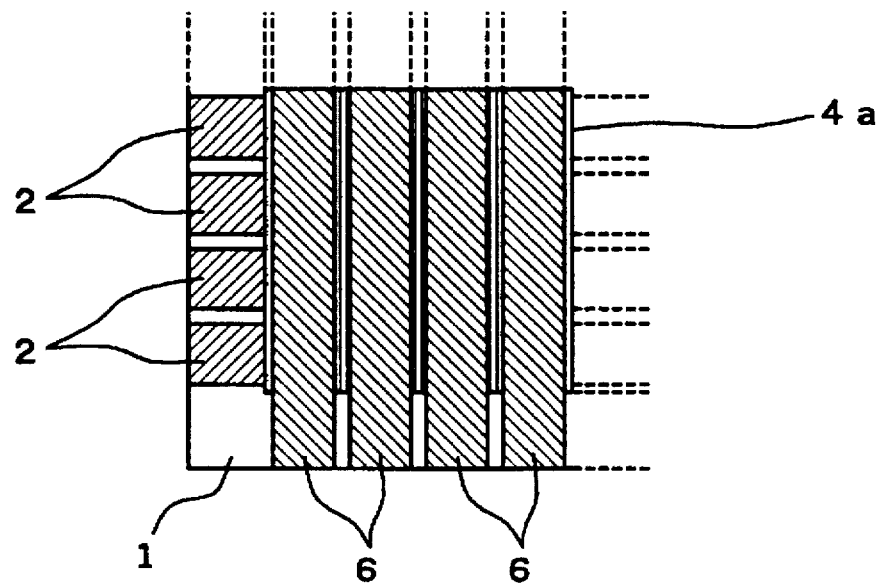
FIG. 11 is a plan view showing a state where an electron injection electrode is formed in a stripe shape on the luminescent layer having electron transporting characteristics in fabricating the organic EL device in the embodiment 13.

The 1AZM-Hex was vacuum evaporated on the hole transporting layer 3 including regions where the first and second luminescent portions 41a and 41b are formed, to from a luminescent layer 4a having electron transporting characteristics, as shown in FIG. 10, and an electron injection electrode 6 composed of a magnesium-indium alloy was further formed by vacuum evaporation on the luminescent layer 4a in a stripe shape in such a manner that the line width d1 is 0.4 mm and the center-to-center pitch d2 is 0.5 mm, similarly to the hole injection electrode 6, in a direction perpendicular to the above-mentioned hole injection electrode 2, as shown in FIG. 11, so that the center of the stripe of the electron injection electrode 6 is overlapped with the centers of dots of the first and second luminescent portions 41a and 41b.

The above-mentioned vacuum evaporation was performed by a resistance heating method using a molybdenum boat and under conditions such as a degree of vacuum of not more than $1 \times 10^{-5}$ Torr and a substrate temperature of 20° to 30° C.

Figure 12:
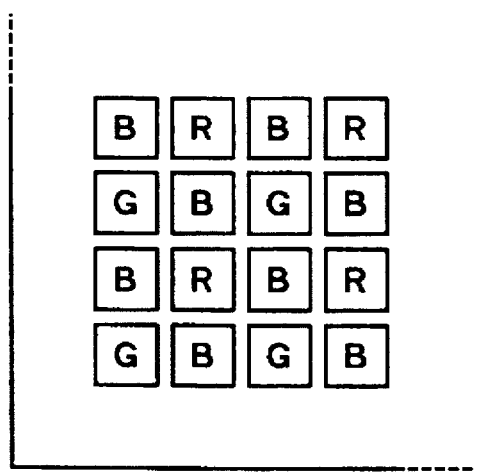
FIG. 12 is a plan view showing the colors of the respective luminescent portions in the organic EL device in the embodiment 13.

A display panel composed of the organic EL device in the present embodiment thus produced has a structure in which green light emitted by the Alq3, red light emitted by the Eu(TTA)3phen, and blue light emitted by the 1AZM-Hex are respectively emitted in a region where the first luminescent portions 41a are formed, in a region where the second luminescent portions 41b are formed, and a region where no luminescent portions 41a and 41b are provided, so that luminescent portions in red (R), green (G) and blue (B) are alternately arranged, as shown in FIG. 12.

Figure 13:
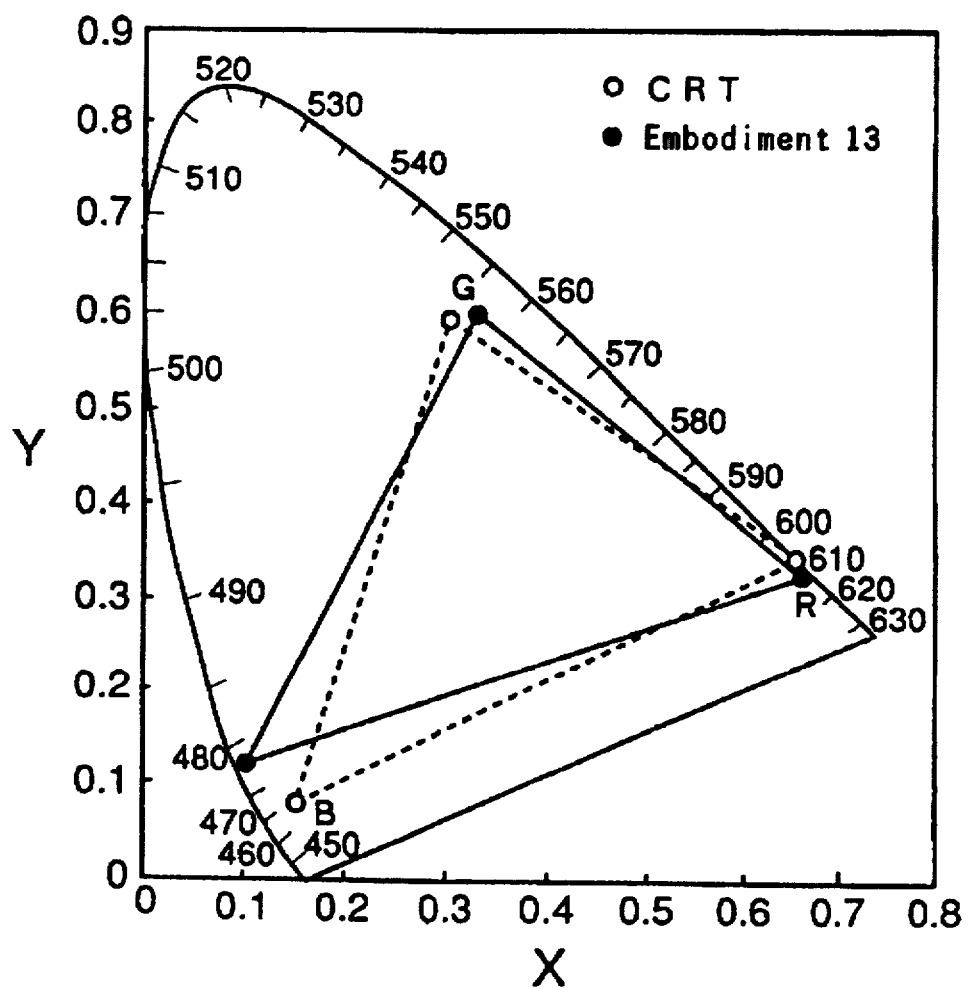
FIG. 13 is a CIE chromaticity diagram in which a display panel composed of the organic EL device in the embodiment 13 and a CRT currently used are compared with each other.

When the display panel is driven, it is possible to display images in various shapes emitting light in various colors which is a combination of the above-mentioned three primary colors. The three primary colors on the display panel are not inferior to those in a CRT currently used, as shown in a CIE chromaticity diagram of FIG. 13, whereby the display panel can be put to practical use as a full-color display.

In the first organic EL device according to the present invention, various known luminescent materials can be employed in addition to the materials employed in the above-mentioned embodiments. Examples are tetraphenylbutadiene indicated by a chemical formula 10, coumarin 343 indicated by a chemical formula 11, coumarin 6 indicated by a chemical formula 12, quinacridone indicated by a chemical formula 13, NK-757 indicated by a chemical formula 14, DCM indicated by a chemical formula 15, and Zn(ac)2 indicated by a chemical formula 16 which respectively have luminescent colors and luminescent peak wavelengths as shown in the following Table 1.

TABLE 1

| luminescent material | luminescent color | luminescent peak wavelength |
|---|---|---|
| tetraphenylbutadiene | blue | 450 nm |
| coumarin 343 | bluish-green | 490 nm |
| coumarin 6 | green | 510 nm |
| quinacridone | yellowish-green | 540 nm |
| NK-757 | yellow | 560 to 590 nm |
| DCM | orange | 580 to 600 nm |
| Zn(ac)2 | red | 650 nm |

[Chemical formula 10]

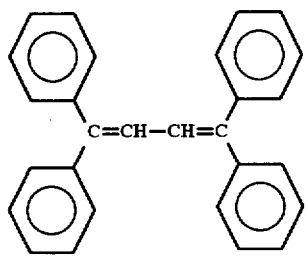

tetraphenylbutadiene

[Chemical formula 11]

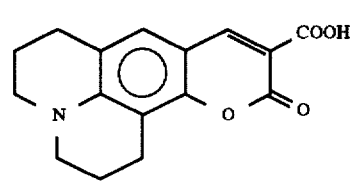

coumarin 343

[Chemical formula 12]

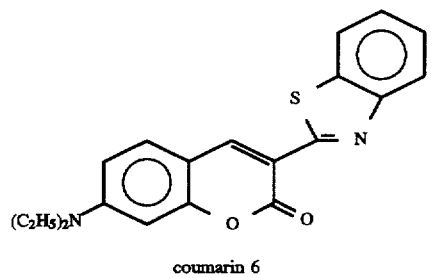

coumarin 6

[Chemical formula 13]

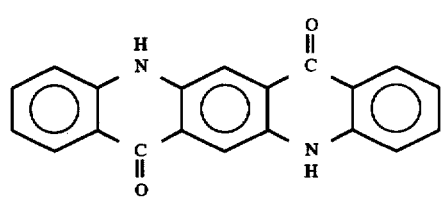

quinacridone

[Chemical formula 14]

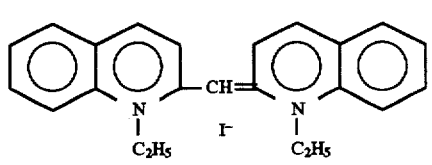

NK-757

TABLE 1-continued

| luminescent material | luminescent color | luminescent peak wavelength |
|---|---|---|

[Chemical formula 15]

DCM

[Chemical formula 16]

Zn(ac)2

Although in the above-mentioned embodiments 1 to 13, the hole transporting layer 3, the electron transporting layer 5, and the like which are in contact with the hole injection electrode 2 and the electron injection electrode 6 are brought into a monolayer, a layer which is in contact with the hole injection electrode 2 can be brought into a lamination layer or a mixed layer using a plurality of hole transporting materials which differ in ionization potential, and a layer which is in contact with the electron injection electrode 6 can be brought into a lamination layer or a mixed layer using a plurality of electron transporting materials which differ in electron affinity in order to increase holes and electrons injecting and transporting characteristics.

Although in the above-mentioned embodiments 1 to 13, the thickness of each of the luminescent portions 41, 41a and 41b is set to 100 Å which is very smaller than those of the other layers, this is for the purpose of preventing to the utmost the possibility that the region where each of the luminescent portions 41, 41a and 41b is formed becomes thicker than the other regions so that the resistance is increased to decrease the luminance. However, the thickness of each of the luminescent portions 41, 41a and 41b is not limited to the same. When the luminance of light in each of the luminescent portions 41, 41a and 41b is higher than the luminance of light in the other luminescent regions, the thickness of each of the luminescent portions can be changed to a suitable thickness in consideration of a balance with the other luminescent regions and the effect of display. For example, the thickness of each of the luminescent portions 41, 41a and 41b is increased to decrease the luminance.

Although in the above-mentioned embodiments 1 to 13, in containing a luminance material in a hole transporting material and an electron transporting material to form the luminescent portions 41, 41a and 41b, the content of the luminescent material is set to 5% by weight, the content of the luminescent material is not limited to the same. The content can be changed as required in order to conform to the nature of the luminescent material employed, for example, and adjust the luminescent color and the luminance.

(Embodiment 14)

Figure 14:
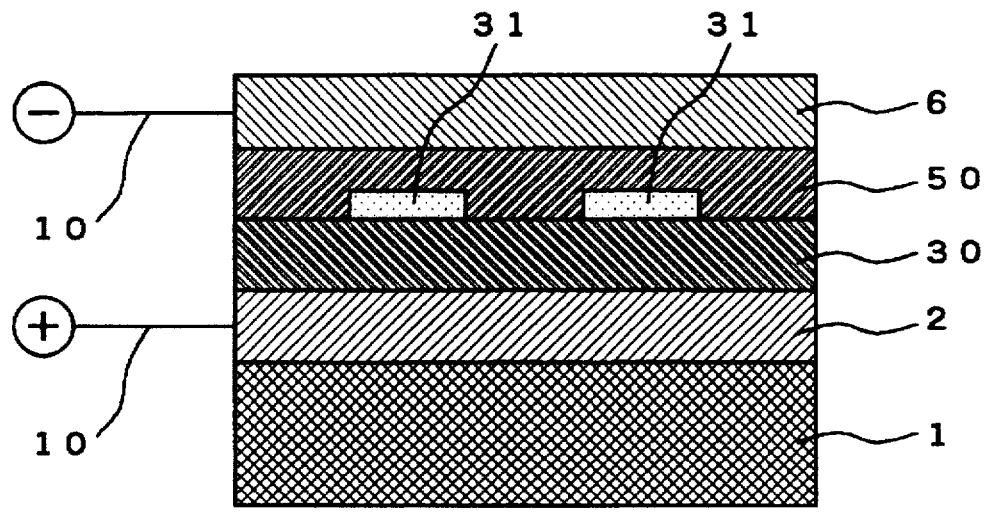
FIG. 14 is a schematic illustration showing a device structure of each of organic EL devices in embodiments 14 and 15 of the present invention.

An organic EL device in the present embodiment has a structure in which a transparent hole injection electrode 2 having a thickness of 2000 Å is formed using ITO on a transparent glass substrate 1, a hole transporting layer 30 having luminous characteristics which has a thickness of 500 Å is formed using PYR-9 indicated by the foregoing chemical formula 4 on the hole injection electrode 2, hole transporting portions 31 having non-luminous characteristics which have thickness of 100 Å are partially formed using MTPD indicated by the foregoing chemical formula 1 on the hole transporting layer 30, an electron transporting layer 50 having luminous characteristics which has a thickness of 500 Å is formed using 1AZM-Hex indicated by the foregoing chemical formula 8 on the hole transporting layer 30 on which the hole transporting portions 31 having non-luminous characteristics are partially formed, and an electron injection electrode 6 having a thickness of 2000 Å composed of a magnesium-indium alloy is further formed on the electron transporting layer 50, as shown in FIG. 14.

Lead wires 10 are respectively connected to the hole injection electrode 2 and the electron injection electrode 6, to apply positive and negative bias voltages to the hole injection electrode 2 and the electron injection electrode 6.

In fabricating the organic EL device in the present embodiment, a glass substrate 1 on which a hole injection electrode 2 composed of ITO is formed was cleaned by a neutral detergent, and was then ultrasonically cleaned, respectively, in acetone for twenty minutes and in ethanol for twenty minutes.

The above-mentioned PYR-9 was then vacuum evaporated on the hole injection electrode 2 formed on the glass substrate 1, to from a hole transporting layer 30 having luminous characteristics, and the above-mentioned MTPD was vacuum evaporated using a metal mask on a part of the hole transporting layer 30, to partially form hole transporting portions 31 having non-luminous characteristics. The above-mentioned 1AZM-Hex was vacuum evaporated on the hole transporting portions 31 and the hole transporting layer 30, to from an electron transporting layer 50 having luminous characteristics, and an electron injection electrode 6 composed of a magnesium-indium alloy was further formed by vacuum evaporation on the electron transporting layer 50. The vacuum evaporation was performed by a resistance heating method using a molybdenum boat and under conditions such as a degree of vacuum of not more than $1 \times 10^{-5}$ Torr and a substrate temperature of 20° to 30° C.

When a voltage of 10 V is applied between the hole injection electrode 2 and the electron injection electrode 6 in the organic EL device according to the present embodiment, blue light having luminance of 400 cd/m² and having a luminescent peak wavelength of 460 nm is emitted in a region where the hole transporting portions 31 having non-luminous characteristics are formed, while bluish-green light having luminance of 1000 cd/m² and having a luminescent peak wavelength of 490 nm is emitted in a region where no hole transporting portions 31 having non-luminous characteristics are formed, to make it possible to simultaneously emit the blue light and the bluish-green light. It is confirmed by an emission spectrum that the blue light in the region where the hole transporting portions 31 having non-luminous characteristics are formed is emitted by the 1AZM-Hex used for the electron transporting layer 50, and the bluish-green light in the region where no hole transporting portions 31 having non-luminous characteristics are formed is emitted by the PYR-9 used for the hole transporting layer 30.

(Embodiment 15)

In the present embodiment 15, an organic EL device is obtained in the same manner as the organic EL device in the above-mentioned embodiment 14 except that the above-mentioned MTPD used for the hole transporting portions 31 having non-luminous characteristics in the embodiment 14 and rubrene indicated by the foregoing chemical formula 2 which is a luminescent material are used as materials composing a hole transporting layer 30 having luminous characteristics, the MTPD and the rubrene are co-evaporated on a hole injection electrode 2 in such a manner that 5% by weight of the rubrene is contained in the MTPD, to form the hole transporting layer 30 having luminous characteristics, and Alq3 indicated the foregoing chemical formula 3 is used as a material composing an electron transporting layer 50 having luminous characteristics.

When a voltage of 10 V is applied between a hole injection electrode 2 and an electron injection electrode 6 in the organic EL device according to the present embodiment, green light having luminance of 1500 cd/m$^2$ and having a luminescent peak wavelength of 520 nm is emitted in a region where hole transporting portions 31 having non-luminous characteristics are formed, while yellow light having luminance of 1300 cd/m$^2$ and having a luminescent peak wavelength of 560 nm is emitted in a region where no hole transporting portions 31 having non-luminous characteristics are formed, to make it possible to simultaneously emit the green light and the yellow light. It is confirmed by an emission spectrum that the green light in the region where the hole transporting portions 31 having non-luminous characteristics are formed is emitted by the Alq3 used for the electron transporting layer 50, and the yellow light in the region where no hole transporting portions 31 having non-luminous characteristics are formed is emitted by the rubrene used for the hole transporting layer 30.

(Embodiment 16)

Figure 15:
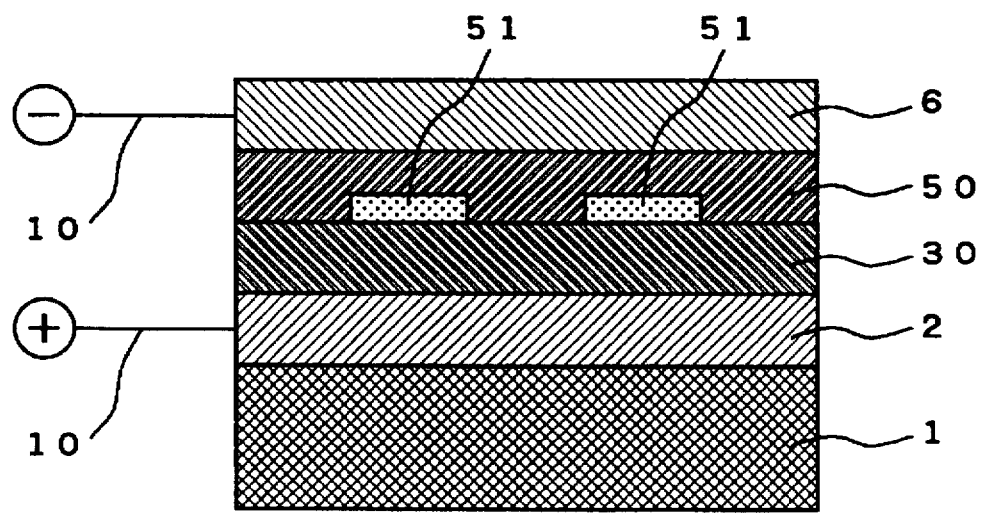
FIG. 15 is a schematic illustration showing a device structure of each of organic EL devices in embodiments 16 and 17 of the present invention.

An organic EL device in the present embodiment has a structure in which a transparent hole injection electrode 2 having a thickness of 2000 Å is formed using ITO on a transparent glass substrate 1, a hole transporting layer 30 having luminous characteristics which has a thickness of 500 Å is formed using PYR-9 indicated by the foregoing chemical formula 4 on the hole injection electrode 2, electron transporting portions 51 having non-luminous characteristics which has a thickness of 100 Å are partially formed using OXD-7 indicated by the foregoing chemical formula 5 on the hole transporting layer 30, an electron transporting layer 50 having luminous characteristics which has a thickness of 500 Å is formed using Alq3 indicated by the foregoing chemical formula 3 on the hole transporting layer 30 on which the electron transporting portions 51 having non-luminous characteristics are partially formed, and an electron injection electrode 6 having a thickness of 2000 Å is further formed using a magnesium-indium alloy on the electron transporting layer 50, as shown in FIG. 15.

Lead wires 10 are respectively connected to the hole injection electrode 2 and the electron injection electrode 6, to apply positive and negative bias voltages to the hole injection electrode 2 and the electron injection electrode 6.

In fabricating the organic EL device in the present embodiment, a glass substrate 1 on which a hole injection electrode 2 composed of ITO is formed was cleaned by a neutral detergent, and was then ultrasonically cleaned, respectively, in acetone for twenty minutes and in ethanol for twenty minutes.

The above-mentioned PYR-9 was then vacuum evaporated on the hole injection electrode 2 formed on the glass substrate 1, to from a hole transporting layer 30 having luminous characteristics, and the above-mentioned OXD-7 was vacuum evaporated using a metal mask on a part of the hole transporting layer 30, to partially form electron transporting portions 51 having non-luminous characteristics. The above-mentioned Alq3 was vacuum evaporated on the electron transporting portions 51 and the hole transporting layer 30, to form an electron transporting layer 50 having luminous characteristics, and an electron injection electrode 6 composed of a magnesium-indium alloy was further formed by vacuum evaporation on the electron transporting layer 50. The vacuum evaporation was performed by a resistance heating method using a molybdenum boat and under conditions such as a degree of vacuum of not more than 1×10$^{-5}$ Torr and a substrate temperature of 20° to 30° C.

When a voltage of 10 V is applied between the hole injection electrode 2 and the electron injection electrode 6 in the organic EL device according to the present embodiment, bluish-green light having luminance of 2000 cd/m$^2$ and having a luminescent peak wavelength of 490 nm is emitted in a region where the electron transporting portions 51 having non-luminous characteristics are formed, while green light having luminance of 1500 cd/m$^2$ and having a luminescent peak wavelength of 520 nm is emitted in a region where no electron transporting portions 51 having non-luminous characteristics are formed, to make it possible to simultaneously emit the bluish-green light and the green light. It is confirmed by an emission spectrum that the bluish-green light in the region where the electron transporting portions 51 having non-luminous characteristics are formed is emitted by the PYR-9 used for the hole transporting layer 30, and the green light in the region where no electron transporting portions 51 having non-luminous characteristics are formed is emitted by the Alq3 used for the electron transporting layer 50.

(Embodiment 17)

In the present embodiment 17, an organic EL device is obtained in the same manner as the organic EL device in the above-mentioned embodiment 16 except that the above-mentioned OXD-7 used for the electron transporting portions 51 having non-luminous characteristics in the embodiment 16 and the above-mentioned rubrene which is a luminescent material are used as materials composing an electron transporting layer 50 having luminous characteristics, and the OXD-7 and the rubrene are co-evaporated on a hole transporting layer 30 and electron transporting layers 51 in such a manner that 5% by weight of the rubrene is contained in the OXD-7, to form an electron transporting layer 50 having luminous characteristics.

When a voltage of 10 V is applied between a hole injection electrode 2 and an electron injection electrode 6 in the organic EL device according to the present embodiment, bluish-green light having luminance of 2000 cd/m$^2$ and having a luminescent peak wavelength of 490 nm is emitted in a region where the electron transporting portions 51 having non-luminous characteristics are formed, while yellow light having luminance of 1000 cd/m$^2$ and having a luminescent peak wavelength of 560 nm is emitted in a region where no electron transporting portions 51 having non-luminous characteristics are formed, to make it possible to simultaneously emit the bluish-green light and the yellow light. It is confirmed by an emission spectrum that the bluish-green light in the region where the electron transporting portions 51 having non-luminous characteristics are formed is emitted by the PYR-9 used for the hole transporting layer 30, and the yellow light in the region where no electron transporting portions 51 having non-luminous characteristics are formed is emitted by the rubrene used for the electron transporting layer 50.

(Embodiment 18)

Figure 16:
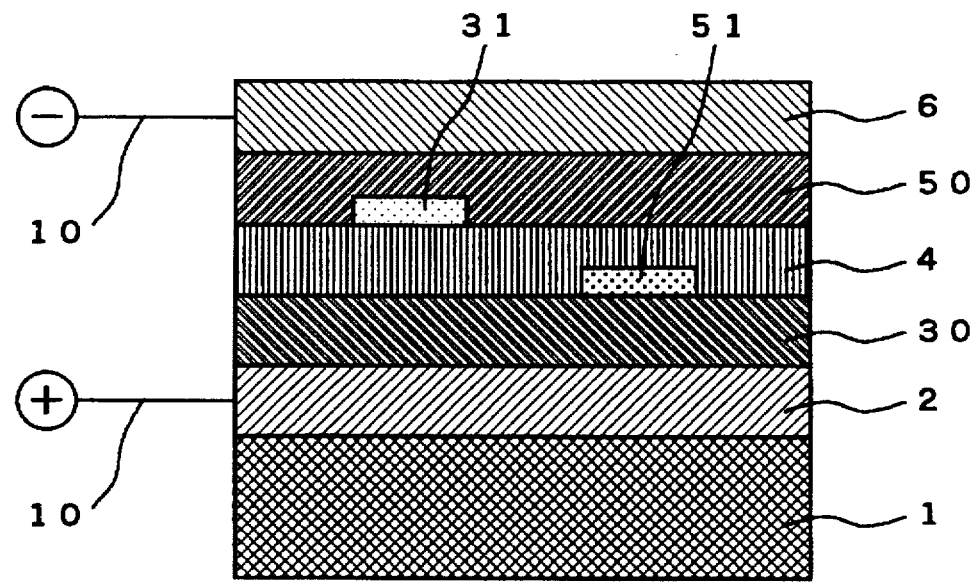
FIG. 16 is a schematic illustration showing a device structure of an organic EL device in an embodiment 18 of the present invention.

An organic EL device in the present embodiment has a structure in which a transparent hole injection electrode 2 having a thickness of 2000 Å is formed using ITO on a transparent glass substrate 1, a hole transporting layer 30 having luminous characteristics which has a thickness of 500 Å is formed using PYR-9 indicated by the foregoing chemical formula 4 on the hole injection electrode 2, electron transporting portions 51 having non-luminous characteristics which has a thickness of 100 Å are partially formed using OXD-7 indicated by the foregoing chemical formula 5 on the hole transporting layer 30, a luminescent layer 4 having a thickness of 100 Å is formed using Eu(TTA)3phen indicated by the foregoing chemical formula 9 on the hole transporting layer 30 on which the electron transporting portions 51 having non-luminous characteristics are partially formed, hole transporting portions 31 having non-luminous characteristics which has a thickness of 100 Å are partially formed using MTPD indicated by the foregoing chemical formula 1 on the luminescent layer 4, an electron transporting layer 50 having luminous characteristics which has a thickness of 500 Å is formed using 1AZM-Hex indicated by the foregoing chemical formula 8 on the hole transporting portions 31 and the luminescent layer 4, and an electron injection electrode 6 having a thickness of 2000 Å is further formed using a magnesium-indium alloy on the electron transporting layer 50, as shown in FIG. 16.

Lead wires 10 are respectively connected to the hole injection electrode 2 and the electron injection electrode 6, to apply positive and negative bias voltages to the hole injection electrode 2 and the electron injection electrode 6.

In fabricating the organic EL device in the present embodiment, a glass substrate 1 on which a hole injection electrode 2 composed of ITO is formed was cleaned by a neutral detergent, and was then ultrasonically cleaned, respectively, in acetone for twenty minutes and in ethanol for twenty minutes.

The above-mentioned PYR-9 was then vacuum evaporated on the above-mentioned hole injection electrode 2 formed on the glass substrate 1, to form a hole transporting layer 30 having luminous characteristics, the above-mentioned OXD-7 was vacuum evaporated using a metal mask on a part of the hole transporting layer 30, to partially form electron transporting portions 51 having non-luminous characteristics, and the above-mentioned Eu(TTA)3phen was vacuum evaporated on the electron transporting portions 51 and the hole transporting layer 30, to form a luminescent layer 4. The above-mentioned MTPD was vacuum evaporated in a region where no electron transporting portions 51 having non-luminous characteristics are provided using the metal mask on the luminescent layer 4, to partially form hole transporting portions 31 having non-luminous characteristics, the above-mentioned 1AZM-Hex was vacuum evaporated on the hole transporting portions 31 and the luminescent layer 4, to form an electron transporting layer 50 having luminous characteristics, and an electron injection electrode 6 composed of a magnesium-indium alloy was further formed by vacuum evaporation on the electron transporting layer 50. The vacuum evaporation was performed by a resistance heating method using a molybdenum boat and under conditions such as a degree of vacuum of not more than $1\times10^{-5}$ Torr and a substrate temperature of 20° to 30° C.

When a voltage of 10 V is applied between the hole injection electrode 2 and the electron injection electrode 6 in the organic EL device according to the present embodiment, bluish-green light having luminance of 500 cd/m$^2$ and having a luminescent peak wavelength of 490 nm is emitted in a region where the electron transporting portions 51 having non-luminous characteristics are formed, blue light having luminance of 200 cd/m$^2$ and having a luminescent peak wavelength of 460 nm is emitted in a region where the hole transporting portions 31 having non-luminous characteristics are formed, and red light having luminance of 50 cd/m$^2$ and having a luminescent peak wavelength of 615 nm is emitted in a region where no electron transporting portion 51 and no hole transporting portions 31 are formed, to make it possible to simultaneously emit the light in three colors, that is, bluish-green, blue and red. It is confirmed by an emission spectrum that the bluish-green light in the region where the electron transporting portions 51 having non-luminous characteristics are formed is emitted by the PYR-9 used for the hole transporting layer 30, the blue light in the region where the hole transporting portions 31 having non-luminous characteristics are formed is emitted by the 1AZM-Hex used for the electron transporting layer 50, and the red light in the regions where no electron transporting portion 51 and no hole transporting portions 31 are formed is emitted by the Eu(TTA)3phen used for the luminescent layer 4.

(Embodiment 19)

Figure 17:
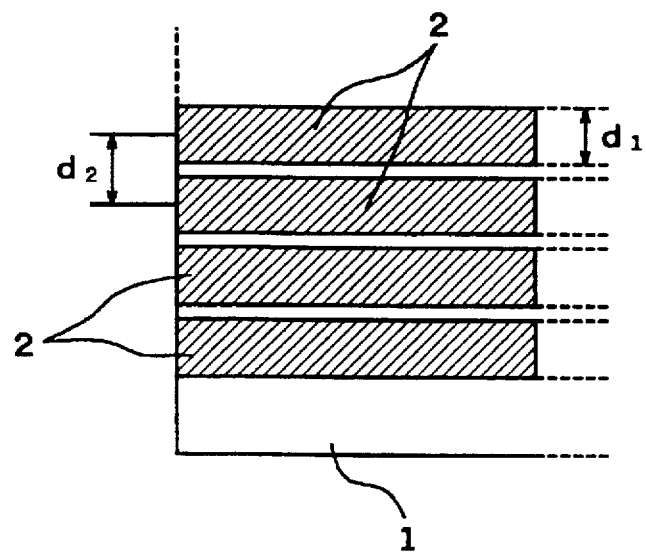
FIG. 17 is a plan view showing a state where a hole injection electrode is formed in a stripe shape on a glass substrate in fabricating an organic EL device in an embodiment 19 of the present invention.

In fabricating an organic EL device in the present embodiment, a hole injection electrode 2 composed of ITO was formed on a glass substrate 1 in a stripe shape in such a manner that the line width d1 is 0.4 mm and the center-to-center pitch d2 is 0.5 mm, after which the hole injection electrode 2 was cleaned by a neutral detergent, and was further ultrasonically cleaned, respectively, in acetone for twenty minutes and in ethanol for twenty minutes, as shown in FIG. 17.

Figure 18:
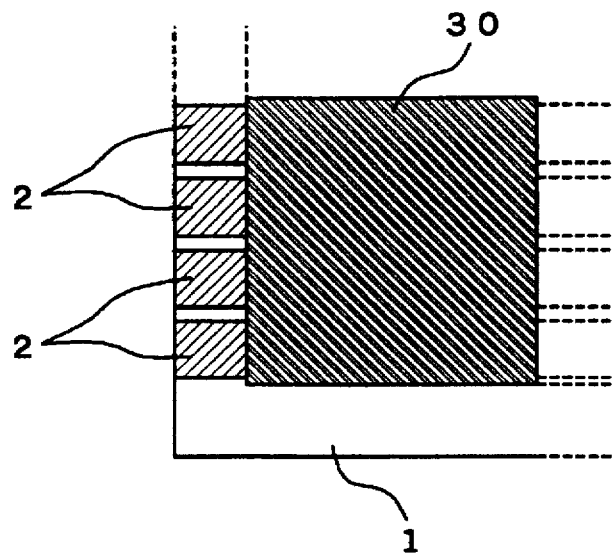
FIG. 18 is a plan view showing a state where a hole transporting layer having luminous characteristics is formed on the hole injection electrode in fabricating the organic EL device in the embodiment 19.

As shown in FIG. 18, MTPD indicated by the foregoing chemical formula 1 and rubrene indicated by the foregoing chemical formula 2 were then co-evaporated on the glass substrate 1 on which the hole injection electrode 2 is formed in such a manner that 5% by weight of the rubrene is contained in the MTPD, to form a hole transporting layer 30 having luminous characteristics.

Figure 19:
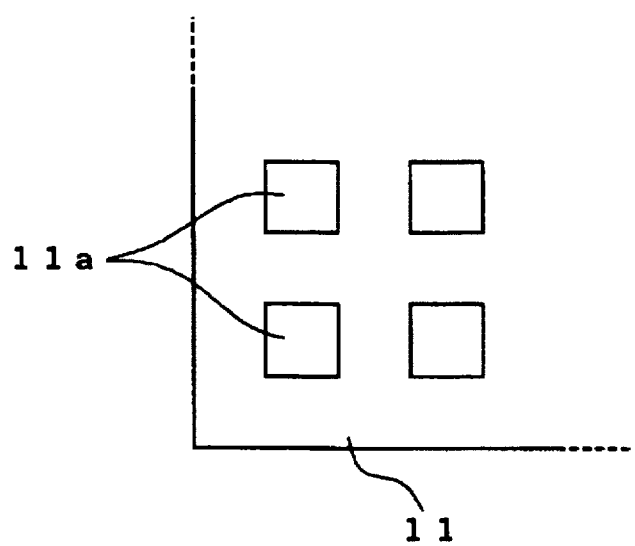
FIG. 19 is a plan view of a metal mask used for partially forming hole transporting portions having non-luminous characteristics on the hole transporting layer in fabricating the organic EL device in the embodiment 19.
Figure 20:
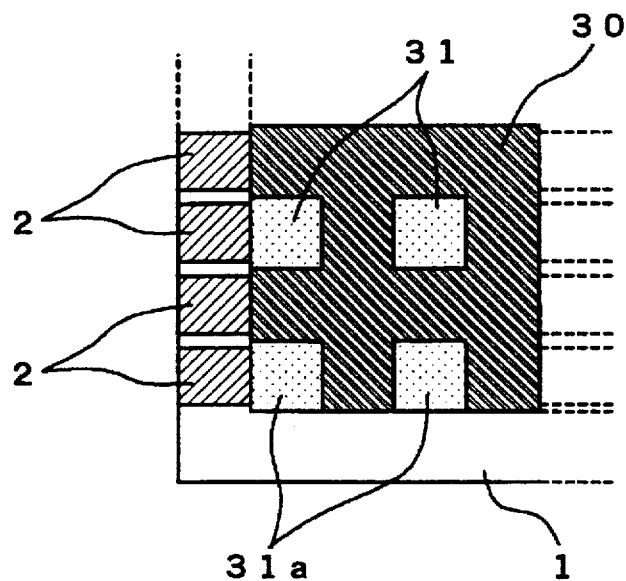
FIG. 20 is a plan view showing a state where the hole transporting portions having non-luminous characteristics are partially formed on the hole transporting layer in fabricating the organic EL device in the embodiment 19.

A metal mask 11 having holes 11a 0.45 mm square arranged at a pitch of 0.55 mm in the longitudinal and transverse directions was used, as shown in FIG. 19, and the MTPD indicted by the foregoing chemical formula 1 was vacuum evaporated on the hole transporting layer 30 in such a manner that the center of each of the holes 11a 0.45 mm square in the metal mask 11 and the center of the stripe of the hole injection electrode 2 are overlapped with each other, to form hole transporting portions 31 having non-luminous characteristics respectively corresponding to portions of the holes 11a in the metal mask 11, as shown in FIG. 20.

Figure 21:
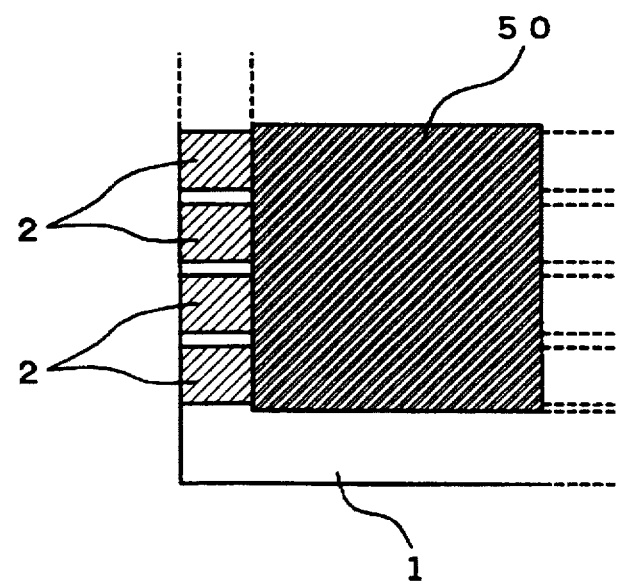
FIG. 21 is a plan view showing a state where an electron transporting layer having luminous characteristics is formed on the hole transporting layer having the hole transporting portions having non-luminous characteristics partially formed therein in fabricating the organic EL device in the embodiment 19.
Figure 22:
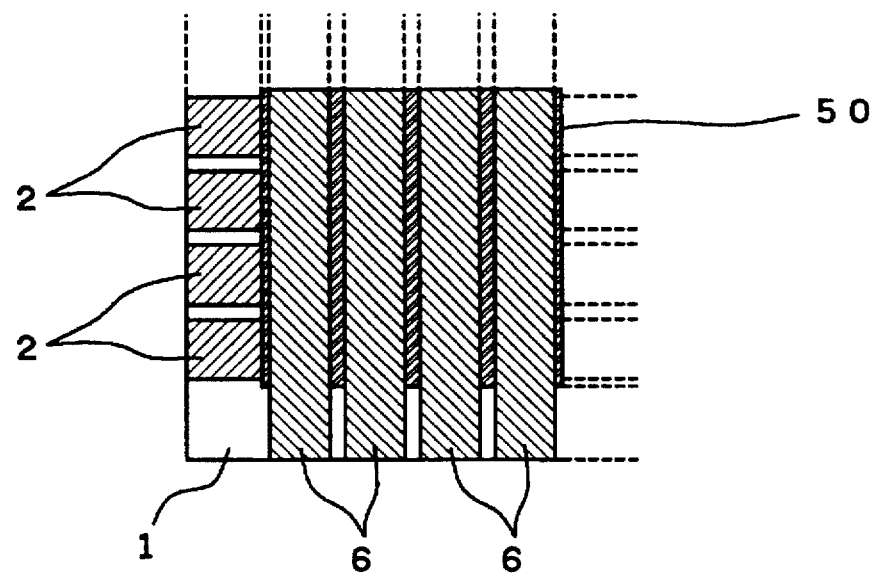
FIG. 22 is a plan view showing a state where an electron injection electrode is formed in a stripe shape on the electron transporting layer in fabricating the organic EL device in the embodiment 19.

1AZM-Hex indicated by the foregoing chemical formula 8 was vacuum evaporated on the hole transporting layer 30 including a region where the hole transporting portions 31 having non-luminous characteristics are formed, to from an electron transporting layer 50 having luminous characteristics, as shown in FIG. 21, after which an electron injection electrode 6 composed of a magnesium-indium alloy was formed by vacuum evaporation on the electron transporting layer 50 in a stripe shape in such a manner that the line width d1 is 0.4 mm and the center-to-center pitch d2 is 0.5 mm in a direction perpendicular to the hole injection electrode 2, as shown in FIG. 22, so that the center of the stripe of the electron injection electrode 6 is overlapped with the centers of dots of the hole transporting portions 31 having non-luminous characteristics.

The above-mentioned vacuum evaporation was performed by a resistance heating method using a molybdenum boat and under conditions such as a degree of vacuum of not more than $1 \times 10^{-5}$ Torr and a substrate temperature of 20° to 30° C.

Figure 23:
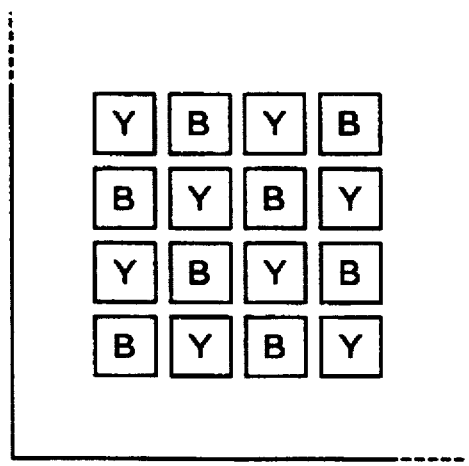
FIG. 23 is a plan view showing the colors of light emitted in a region where the hole transporting portions having non-luminous characteristics are provided and a region where no hole transporting portions having non-luminous characteristics are provided in the organic EL device in the embodiment 19.

In a display panel composed of the organic EL device in the present embodiment, when a voltage of 10 V is applied between the hole injection electrode 2 and the electron injection electrode 6, blue (B) light emitted by 1AZM-Hex having luminance of 400 cd/m² and having a luminescent peak wavelength of 460 nm is emitted in a region where the hole transporting portions 31 having non-luminous characteristics are formed, while yellow (Y) light emitted by rubrene having luminance of 800 cd/m² and having a luminescent peak wavelength of 560 nm is emitted in a region where no hole transporting portions 31 having non-luminous characteristics are formed, as shown in FIG. 23. When the display is driven, it is possible to display images emitting light in various colors from blue to yellow.

Although in the respective organic EL devices in the above-mentioned embodiments 15, 17 and 19, rubrene is employed for a luminescent material contained in the hole transporting layer 30 and the electron transporting layer 50, the luminescent material employed is not limited to the same. Examples of the luminescent material include known luminescent materials such as tetraphenylbutadiene, coumarin 343, coumarin 6, quinacridone, NK-757, DCM, and Zn(ac)2 respectively indicated by the foregoing chemical formulas 10 to 16.

Although the content of rubrene which is a luminescent material is set to 5% by weight in the above-mentioned embodiments, the content is not limited to the same. The content can be changed as required in order to conform to the nature of the luminescent material employed, for example, and adjust the luminescent color and the luminance.

Although in the organic EL device in each of the above-mentioned embodiments, the hole transporting layer 30 having luminous characteristics and the electron transporting layer 50 having luminous characteristics are so provided as to be brought into contact with the hole injection electrode 2 and the electron injection electrode 6, a layer which is in contact with the hole injection electrode 2 can be brought into a lamination layer or a mixed layer using a plurality of hole transporting materials which differ in ionization potential, and a layer which is in contact with the electron injection electrode 6 can be brought into a lamination layer or a mixed layer using a plurality of electron transporting materials which differ in electron affinity in order to improve the injection of holes and electrons into the hole transporting layer 30 and the electron transporting layer 50, for example.

Although in the organic EL device in each of above-mentioned embodiments 14 to 19, the thicknesses of the hole transporting portions 31 having non-luminous characteristics and the electron transporting portions 51 having non-luminous characteristics are made as small as 100 Å, to prevent to the utmost the possibility that the resistance in the portions are increased to decrease the luminance. However, the thicknesses of the hole transporting portions 31 having non-luminous characteristics and the electron transporting portions 51 having non-luminous characteristics can be changed. When the luminance in the regions where the hole transporting portions 31 and the electron transporting portion 51 are formed is higher than the luminance in the other luminescent regions, the thicknesses can be changed into suitable thicknesses in consideration of a balance with the other luminescent regions and the effect of display. For example, the thicknesses of the hole transporting portions 31 and the electron transporting portions 51 are increased to decrease the luminance in the portions.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An organic electroluminescent device having at least a carrier transporting layer and a luminescent layer which use an organic material provided between a hole injection electrode and an electron injection electrode, wherein a luminescent portion having a luminescent peak wavelength different from a luminescent peak wavelength in said luminescent layer is partially provided in such a manner that it is laminated on the luminescent layer, the luminescent portion and luminescent layer being formed of an electroluminescent organic material that emits light by recombination of charges.

2. The organic electroluminescent device according to claim 1, wherein said carrier transporting layer is a hole transporting layer, the hole transporting layer and a luminescent layer having electron transporting characteristics are provided between the hole injection electrode and the electron injection electrode, and a luminescent portion having a luminescent peak wavelength different from a luminescent peak wavelength in the luminescent layer is partially provided between the luminescent layer and the hole transporting layer in such a manner that it is laminated on the luminescent layer.

3. The organic electroluminescent device according to claim 1, wherein said carrier transporting layer is an electron transporting layer, a luminescent layer having hole transporting characteristics and said electron transporting layer are provided between the hole injection electrode and the electron injection electrode, and a luminescent portion having a luminescent peak wavelength different from a luminescent peak wavelength in the luminescent layer is partially provided between the luminescent layer and the electron transporting layer in such a manner that it is laminated on the luminescent layer.

4. The organic electroluminescent device according to claim 1, wherein the luminescent peak wavelength in said luminescent portion is longer than the luminescent peak wavelength in the luminescent layer.

5. The organic electroluminescent device according to claim 1, wherein a plurality of types of luminescent portions having luminescent peak wavelengths which are respectively different from the luminescent peak wavelength in said luminescent layer are partially provided in such a manner that they are respectively laminated on the luminescent layer.

6. An organic electroluminescent device having at least a hole transporting layer having luminous characteristics and an electron transporting layer having luminous characteristics which respectively contain organic materials emitting fluorescence in different colors in a visible region provided between a hole injection electrode and an electron injection electrode, the organic materials emitting light by recombination of charges, wherein when said hole transporting layer having luminous characteristics emits light, a hole transporting portion having non-luminous characteristics is partially provided between the hole transporting layer having luminous characteristics and said electron transporting layer having luminous characteristics.

7. The organic electroluminescent device according to claim 6, wherein the same hole transporting material is used for the hole transporting portion having non-luminous characteristics and the hole transporting layer having luminous characteristics, and a luminescent material is contained in the hole transporting layer having luminous characteristics.

8. An organic electroluminescent device having at least a hole transporting layer having luminous characteristics and an electron transporting layer having luminous characteristics which respectively contain organic materials emitting fluorescence in different colors in a visible region provided between a hole injection electrode and an electron injection electrode, the organic materials emitting light by recombination of charges, wherein when said electron transporting layer having luminous characteristics emits light, an electron transporting portion having non-luminous characteristics is partially provided between the electron transporting layer having luminous characteristics and said hole transporting layer having luminous characteristics.

9. The organic electroluminescent device according to claim 8, wherein the same electron transporting material is used for the electron transporting portion having non-luminous characteristics and the electron transporting layer having luminous characteristics, and a luminescent material is contained in the electron transporting layer having luminous characteristics.

10. An organic electroluminescent device having at least a hole transporting layer having luminous characteristics, a luminescent layer, and an electron transporting layer having luminous characteristics which respectively contain organic materials emitting fluorescence in different colors in a visible region provided between a hole injection electrode and an electron injection electrode, the organic materials emitting light by recombination of charges, and having at least one of (a) an electron transporting portion having non-luminous characteristics partially provided between the hole transporting layer having luminous characteristics and the luminescent layer and (b) a hole transporting portion having non-luminous characteristics partially provided between the luminescent layer and the electron transporting layer having luminous characteristics.

\* \* \* \* \*